(12) United States Patent
Endo

(10) Patent No.: US 8,400,832 B2
(45) Date of Patent: Mar. 19, 2013

(54) SEMICONDUCTOR DEVICE

(75) Inventor: Masato Endo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 13/014,212

(22) Filed: Jan. 26, 2011

(65) Prior Publication Data
US 2011/0188309 A1 Aug. 4, 2011

(30) Foreign Application Priority Data

Jan. 29, 2010 (JP) ................................. 2010-018887

(51) Int. Cl.
G11C 11/34 (2006.01)
H01L 29/76 (2006.01)

(52) U.S. Cl. ......... 365/185.17; 365/185.21; 365/185.33; 257/314

(58) Field of Classification Search ............. 365/185.17, 365/185.21, 185.33; 257/314
See application file for complete search history.

(56) References Cited

U.S. PATENT DOCUMENTS

| | | | |
|---|---|---|---|
| 6,411,548 B1 * | 6/2002 | Sakui et al. | 365/185.17 |
| 7,272,042 B2 * | 9/2007 | Nakai | 365/185.17 |
| 7,583,533 B2 | 9/2009 | Kutsukake et al. | |
| 7,649,777 B2 * | 1/2010 | Ichige et al. | 365/185.17 |
| 7,839,679 B2 * | 11/2010 | Hosono et al. | 365/185.17 |
| 7,983,083 B2 * | 7/2011 | Tamon | 365/185.17 |

FOREIGN PATENT DOCUMENTS

JP 2007-234878 9/2007

* cited by examiner

Primary Examiner — Trong Phan
(74) Attorney, Agent, or Firm — Oblon, Spivak, McClelland, Maier & Neustadt, L.L.P.

(57) ABSTRACT

According to one embodiment, a semiconductor device includes a first circuit unit having first and second interconnects, a second circuit unit having third and fourth interconnects, and an intermediate unit provided therebetween and having first and second transistors juxtaposed to each other along a direction perpendicular to a direction from the first circuit unit toward the second circuit unit. A high impurity concentration region in a first connection region of one diffusion layer of the first transistor is connected to the first interconnect, and other diffusion layer is connected to the third interconnect. A distance from the first connection region to a gate is longer than a distance from the second connection region to a gate. An midpoint region with a narrower width than the first connection region is provided between the gate and the first connection region of the one diffusion layer of the first transistor.

19 Claims, 14 Drawing Sheets

US 8,400,832 B2

SEMICONDUCTOR DEVICE

CROSS-REFERENCE TO RELATED APPLICATIONS

This application is based upon and claims the benefit of priority from the prior Japanese Patent Application No. 2010-018887, filed on Jan. 29, 2010; the entire contents of which are incorporated herein by reference.

FIELD

Embodiments described herein relate generally to a semiconductor device.

BACKGROUND

Bit lines of a memory cell array, for example, are connected to sense amplifiers via transistors in semiconductor devices such as NAND nonvolatile semiconductor memory devices. As the pitch of the bit lines is reduced, the pitch of the transistors also is reduced; and the contact portions connecting the bit lines to the transistors also are reduced. In the case where the contact portions are reduced, the junction breakdown voltage, for example, decreases; and the reliability deteriorates.

JP-A 2007-234878 (Kokai) discusses technology in which an impurity region that sets a threshold voltage is formed in the transistor region and the occupied surface area of the region where the transistors are formed is reduced. There is room for improvement to ensure high reliability while reducing the occupied surface area and reducing the chip surface area.

DETAILED DESCRIPTION

Figure 1:
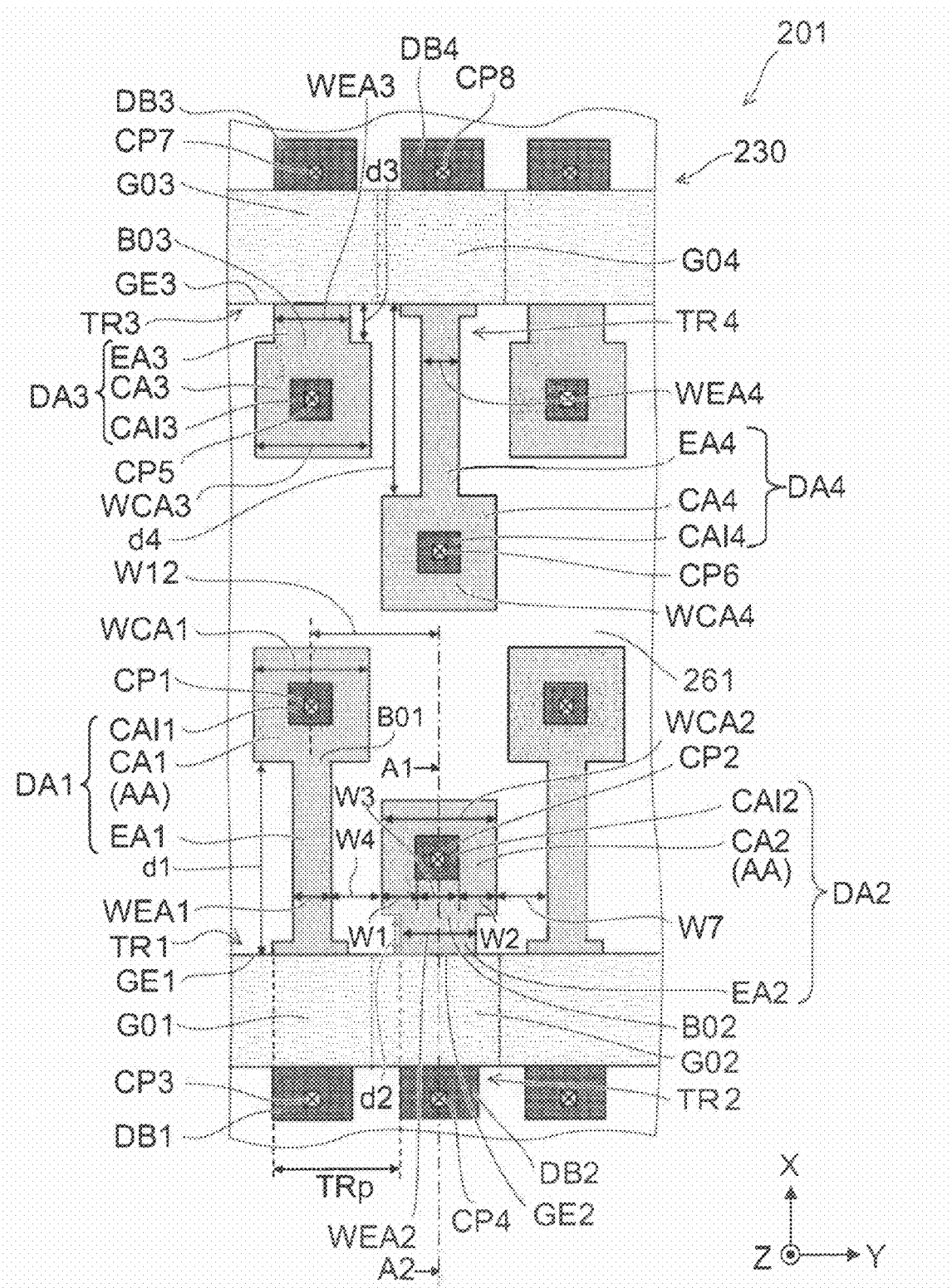
FIG. 1 is a schematic plan view illustrating the configuration of a semiconductor device according to a first embodiment.

In general, according to one embodiment, a semiconductor device includes a first circuit unit provided in a major surface of a semiconductor substrate, a second circuit unit provided in the major surface to oppose the first circuit unit along a first direction parallel to the major surface and an intermediate unit provided between the first circuit unit and the second circuit unit. The first circuit unit includes a first interconnect provided above the major surface to extend in the first direction and a second interconnect provided above the major surface to extend in the first direction. The second interconnect is juxtaposed to the first interconnect along a second direction parallel to the major surface and perpendicular to the first direction. The second circuit unit includes a third interconnect provided above the major surface to extend in the first direction and a fourth interconnect provided above the major surface to extend in the first direction. The fourth interconnect is juxtaposed to the third interconnect along the second direction from the first interconnect toward the second interconnect. The intermediate unit includes a first transistor and a second transistor. The first transistor includes a first one diffusion layer, a first other diffusion layer, and a first gate electrode. The first one diffusion layer and the first other diffusion layer are provided in the major surface. The first gate electrode is provided above the major surface between the first one diffusion layer and the first other diffusion layer to extend in the second direction. The second transistor is provided in the major surface juxtaposed to the first transistor along the second direction from the first interconnect toward the second interconnect. The second transistor includes a second one diffusion layer, a second other diffusion layer, and a second gate electrode. The second one diffusion layer and the second other diffusion layer are provided in the major surface. The second gate electrode is provided above the major surface between the second one diffusion layer and the second other diffusion layer to extend in the second direction. The second gate electrode is juxtaposed to the first gate electrode along the second direction and connected to the first gate electrode. The first one diffusion layer includes a first connection region, a first midpoint region provided on the first gate electrode side of the first connection region and connected to the first connection region, and a first inner connection region provided inside the first connection region and electrically connected to the first interconnect. The width of the first midpoint region along the second direction is narrower than a width of the first connection region along the second direction. The first other diffusion layer is electrically connected to the third interconnect. The second one diffusion layer includes a second connection region, a second midpoint region provided on the second gate electrode side of the second connection region and connected to the second connection region, and a second inner connection region provided inside the second connection region and electrically connected to the second interconnect. The width of the second midpoint region along the second direction is narrower than a width of the second connection region along the second direction. The second other diffusion layer is electrically connected to the fourth interconnect. An impurity type of the first and second connection regions, the first and second midpoint regions, and the first and second inner connection regions is a first conductivity type. An impurity concentration of the first and second inner connection regions is higher than an impurity concentration of the first and second connection regions. A distance along the first direction from a boundary between the first connection region and the first midpoint region to an edge of the first gate electrode on the first connection region side is longer than a distance along the first direction from a boundary between the second connection region and the second midpoint region to an edge of the second gate electrode on the second connection region side.

Embodiments will now be described with reference to the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic plan view illustrating the configuration of a semiconductor device according to a first embodiment.

Figure 2:
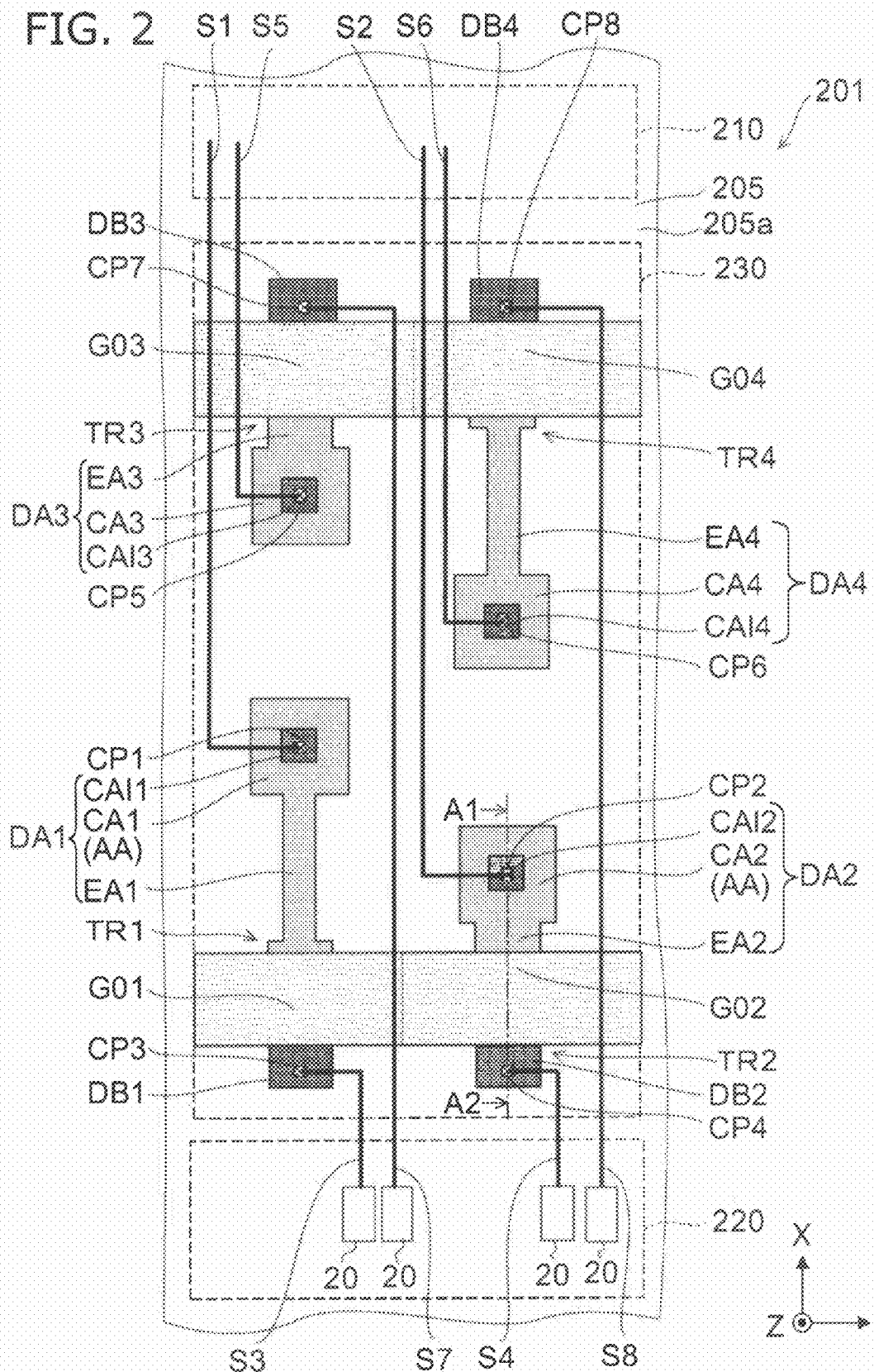
FIG. 2 is a schematic view illustrating the configuration of the semiconductor device according to the first embodiment.

FIG. 2 is a schematic view illustrating the configuration of the semiconductor device according to the first embodiment.

Namely, FIG. 2 illustrates the connectional relationship of the interconnects of the semiconductor device. Accordingly, the scale, disposition, etc., of the planar configuration of FIG. 2 are different from the actual values.

Figure 3:
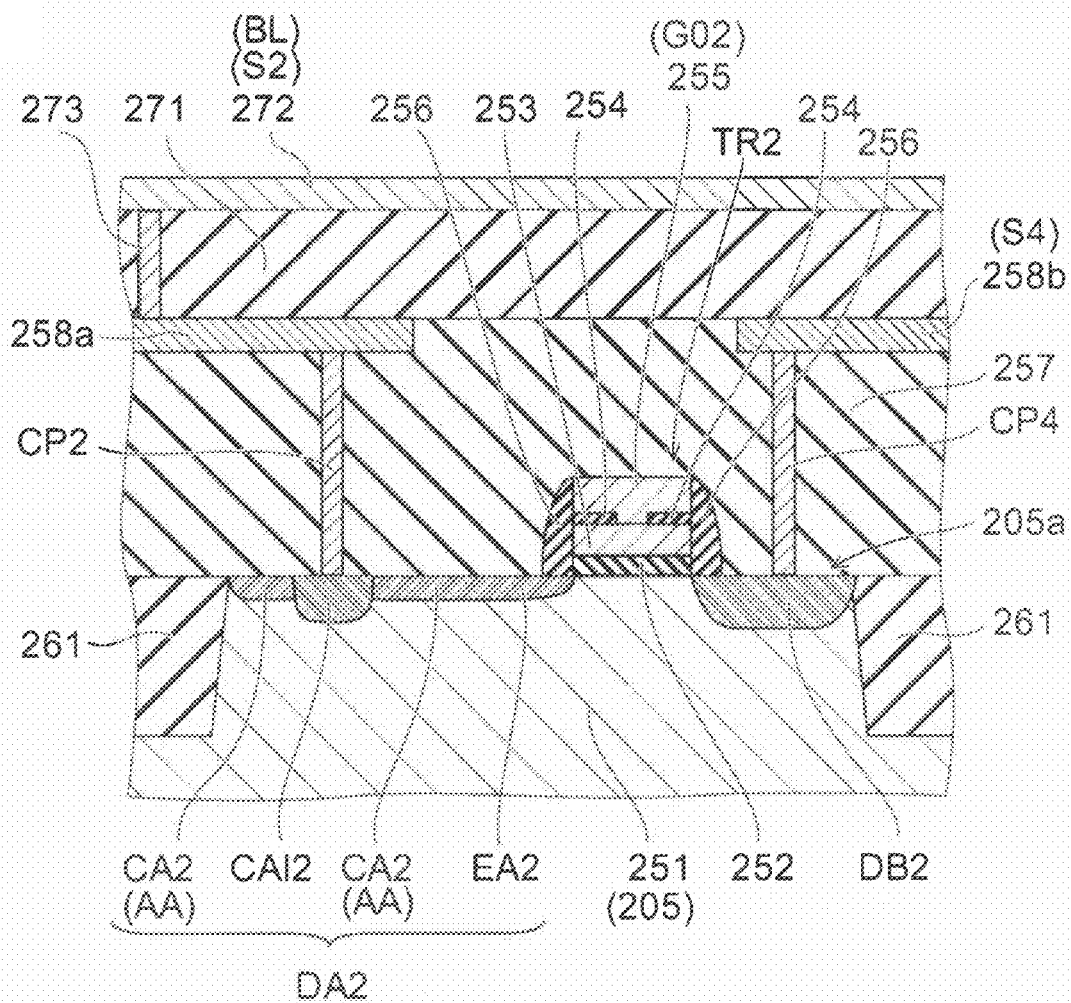
FIG. 3 is a schematic cross-sectional view illustrating the configuration of the semiconductor device according to the first embodiment.

FIG. 3 is a schematic cross-sectional view illustrating the configuration of the semiconductor device according to the first embodiment.

Namely, FIG. 3 is a cross-sectional view along line A1-A2 of FIG. 1.

First, an overview of the configuration of the semiconductor device 201 according to this embodiment will be described using FIG. 2.

As illustrated in FIG. 2, the semiconductor device 201 includes a first circuit unit 210, a second circuit unit 220, and an intermediate unit 230 provided in a major surface 205a of a semiconductor substrate 205. The major surface may be a major surface of a semiconductor substrate or a major surface of a semiconductor layer (e.g., a well) provided on a semiconductor substrate.

The second circuit unit 220 is provided in the major surface 205a and opposes the first circuit unit 210 along a first direction parallel to the major surface 205a. The intermediate unit 230 is provided between the first circuit unit 210 and the second circuit unit 220.

Herein, a direction perpendicular to the major surface 205a is taken as a Z-axis direction. A direction perpendicular to the Z-axis direction is taken as an X-axis direction; and a direction perpendicular to the Z-axis direction and the X-axis direction is taken as a Y-axis direction. The first direction is taken to be the X-axis direction; the second direction is taken to be the Y-axis direction; and the third direction is taken to be the Z-axis direction.

The first circuit unit 210 is, for example, a memory cell array unit of a nonvolatile semiconductor memory device. The second circuit unit 220 is, for example, a sense amplifier unit and the like that identifies information stored in the memory cells of the memory cell array unit recited above. The intermediate unit 230 may include, for example, a switching unit providing a control such that, for example, a high voltage applied to the elements of the first circuit unit 210 is not applied to the elements included in the second circuit unit 220. However, this embodiment is not limited thereto. Any configuration that provides the effects of this embodiment can be applied to the first circuit unit 210, the second circuit unit 220, and the intermediate unit 230.

The first circuit unit 210 includes a first interconnect S1 provided above the major surface 205a to extend in the first direction (in this specific example, the X-axis direction) and a second interconnect S2 provided above the major surface 205a to extend in the first direction, where the second interconnect S2 is juxtaposed to the first interconnect S1 along the second direction (in this specific example, the Y-axis direction) parallel to the major surface 205a and perpendicular to the first direction. The first interconnect S1 and the second interconnect S2 are, for example, bit lines of the nonvolatile semiconductor memory device. Herein, this includes the case where one or multiple interconnects are disposed between the first interconnect S1 and the second interconnect S2.

The second circuit unit 220 includes a third interconnect S3 provided above the major surface 205a to extend in the first direction and a fourth interconnect S4 provided above the major surface 205a to extend in the first direction, where the fourth interconnect S4 is juxtaposed to the third interconnect S3 along the second direction from the first interconnect S1 toward the second interconnect S2. Herein, this includes the case where one or multiple interconnects are disposed between the third interconnect S3 and the fourth interconnect S4.

The intermediate unit 230 includes a first transistor TR1 and a second transistor TR2. An insulating layer 261 is provided between the first transistor TR1 and the second transistor TR2. An STI (a Shallow Trench Isolation) provided in the major surface 205a, for example, may be used as the insulating layer 261.

As illustrated in FIG. 1 and FIG. 2, the first transistor TR1 includes a first one diffusion layer DA1 and a first other diffusion layer DB1 provided in the major surface 205a and a first gate electrode G01. The first one diffusion layer DA1 and the first other diffusion layer DB1 oppose each other along the first direction. The first gate electrode G01 is provided above the major surface 205a between the first one diffusion layer DA1 and the first other diffusion layer DB1 to extend in the second direction (the Y-axis direction).

The second transistor TR2 is provided in the major surface 205a juxtaposed to the first transistor TR1 along the second direction from the first interconnect S1 toward the second interconnect S2. The second transistor TR2 includes a second one diffusion layer DA2 and a second other diffusion layer DB2 provided in the major surface and a second gate electrode G02. The second one diffusion layer DA2 and the second other diffusion layer DB2 oppose each other along the first direction. The second gate electrode G02 is provided above the major surface 205a between the second one diffusion layer DA2 and the second other diffusion layer DB2. The second gate electrode G02 extends in the second direction, is juxtaposed to the first gate electrode G01 along the second direction, and is connected to the first gate electrode G01. The position of the first gate electrode G01 in the first direction is the same as the position of the second gate electrode G02 in the first direction.

The first one diffusion layer DA1 includes a first connection region CA1, a first midpoint region EA1, and a first inner connection region CAI1. The first midpoint region EA1 is provided on the first gate electrode G01 side of the first connection region CA1 and is connected to the first connection region CA1. A width WEA1 of the first midpoint region EA1 along the second direction is narrower than a width WCA1 of the first connection region CA1 along the second direction. Hereinbelow, unless otherwise noted, "width along the second direction" means the width of the region substantially at the central vicinity thereof in the first direction. The first inner connection region CAI1 is provided inside the first connection region CA1 and is electrically connected to the first interconnect S1. In this specific example, a first contact plug CP1 extending in the third direction (the Z-axis direction) is provided in the first inner connection region CAI1; and the first inner connection region CAI1 is electrically connected to the first interconnect S1 via the first contact plug CP1.

The first other diffusion layer DB1 is electrically connected to the third interconnect S3. In this specific example, a third contact plug CP3 extending in the Z-axis direction is provided in the first other diffusion layer DB1; and the first other diffusion layer DB1 is electrically connected to the third interconnect S3 via the third contact plug CP3.

The width along the second direction of the boundary between the first other diffusion layer DB1 and the first gate electrode G01 is substantially equal to the width along the second direction of the boundary between the first midpoint region EA1 and the first gate electrode G01. For example, the former is not less than 80% and not more than 120% of the latter. For example, the width along the second direction of the boundary between the first midpoint region EA1 and the first gate electrode G01 is greater than the width along the second direction of the first midpoint region EA1 at the central portion in the first direction. The width along the second direction of the boundary between the first other diffusion layer DB1 and the first gate electrode G01 is greater than the width along the second direction of the first midpoint region EA1 at the central portion in the first direction. As a result, the characteristic fluctuation of the first transistor TR1 can be suppressed.

The second one diffusion layer DA2 includes a second connection region CA2, a second midpoint region EA2, and a second inner connection region CAI2. The second midpoint region EA2 is provided on the second gate electrode G02 side of the second connection region CA2 and is connected to the second connection region CA2. A width WEA2 of the second midpoint region EA2 along the second direction is narrower than a width WCA2 of the second connection region CA2 along the second direction. The second inner connection region CAI2 is provided inside the second connection region CA2 and is electrically connected to the second interconnect S2. In this specific example, a second contact plug CP2 extending in the Z-axis direction is provided in the second inner connection region CAI2; and the second inner connection region CAI2 is electrically connected to the second interconnect S2 via the second contact plug CP2.

The second other diffusion layer DB2 is electrically connected to the fourth interconnect S4. In this specific example, a fourth contact plug CP4 extending in the Z-axis direction is provided in the second other diffusion layer DB2; and the second other diffusion layer DB2 is electrically connected to the fourth interconnect S4 via the fourth contact plug CP4.

The width along the second direction of the boundary between the second other diffusion layer DB2 and the second gate electrode G02 is substantially equal to the width along the second direction of the boundary between the second midpoint region EA2 and the second gate electrode G02. For example, the former is not less than 80% and not more than 120% of the latter. The width of the second other diffusion layer DB2 along the second direction is substantially equal to the width of the first other diffusion layer DB1 along the second direction. For example, the former is not less than 80% and not more than 120% of the latter.

The impurity type of the first connection region CA1, the second connection region CA2, the first midpoint region EA1, the second midpoint region EA2, the first inner connection region CAI1, and the second inner connection region CAI2 is the first conductivity type. Herein, the case is described where the first conductivity type is an n type and the second conductivity type is a p type. In this embodiment, the first conductivity type may be the p type and the second conductivity type may be the n type.

The impurity concentration of the first inner connection region CAI1 and the second inner connection region CAI2 is higher than the impurity concentration of the first connection region CA1 and the second connection region CA2. In other words, the first inner connection region CAI1 and the second inner connection region CAI2 are, for example, $n^+$ layers; and the first connection region CA1 and the second connection region CA2 are $n^-$ layers. The first midpoint region EA1 and the second midpoint region EA2 are $n^-$ layers.

On the other hand, the first other diffusion layer DB1 and the second other diffusion layer DB2 have the first conductivity type. The first other diffusion layer DB1 and the second other diffusion layer DB2 are, for example, $n^+$ layers.

In the semiconductor device 201 according to this embodiment as illustrated in FIG. 1, a distance d1 along the first direction from a boundary B01 between the first connection region CA1 and the first midpoint region EA1 to an edge GE1 of the first gate electrode G01 on the first connection region CA1 side is longer than a distance d2 along the first direction from a boundary B02 between the second connection region CA2 and the second midpoint region EA2 to an edge GE2 of the second gate electrode G02 on the second connection region CA2 side.

Here, in some cases, the connection between the first connection region CA1 and the first midpoint region EA1 is smooth; and the width along the second direction changes continuously between the first connection region CA1 and the first midpoint region EA1. Also, in some cases, the connection between the second connection region CA2 and the second midpoint region EA2 is smooth; and the width along the second direction changes continuously between the second connection region CA2 and the second midpoint region EA2. In such cases, the boundaries B01 and B02 are taken as substantially the central portions in the first direction from the portion where the change of the width along the second direction starts to the portion where the change of the width along the second direction ends.

Thereby, a semiconductor device can be provided in which high reliability is realized while the chip surface area is reduced.

In other words, in the semiconductor device 201 as illustrated in FIG. 1, the first transistor TR1 and the second transistor TR2 are multiply provided alternately along the Y-axis direction. In such a case, the first connection region CA1, which has a wide width along the Y-axis direction and is distal to the first gate electrode G01, and the second connection region CA2, which has a wide width along the Y-axis direction and is proximal to the second gate electrode G02, are disposed alternately along the Y-axis direction. Then, the first midpoint region EA1, which has a narrow width along the Y-axis direction, and the second connection region CA2 can oppose each other along the Y-axis direction. In other words, the first connection region CA1 and the second connection region CA2, which have wide Y-axis direction widths, are not juxtaposed to each other along the Y-axis direction. Thereby, the spacing along the Y-axis direction between the first transistor TR1 and the second transistor TR2 can be reduced; and the disposition pitch of the transistors along the Y-axis direction can be reduced.

Then, the widths of the first connection region CA1 and the second connection region CA2 along the Y-axis direction can be maintained at large values even in the case where a disposition pitch TRp of the transistors along the Y-axis direction (in FIG. 1, for example, the second-direction distance from the end portion of the left side of the first other diffusion layer DB1 of the first transistor TR1 to the end portion of the left side of the second other diffusion layer DB2 of the second transistor TR2) is reduced. Thereby, a decrease of the junction breakdown voltages of the first connection region CA1 and the second connection region CA2 can be suppressed. The effect of maintaining high junction breakdown voltages by maintaining large values of the widths of the first connection region CA1 and the second connection region CA2 is described below.

The width WCA1 of the first connection region CA1 along the second direction (the Y-axis direction) may be set to be greater than ½ of a distance W12 along the second direction from the center of the first connection region CA1 along the second direction to the center of the second connection region CA2 along the second direction.

Herein, the distance W12 is substantially equal to the transistor disposition pitch TRp of the first transistor TR1 and the second transistor TR2. For example, the former is not less than 80% and not more than 120% of the latter.

Thus, the width WCA1 of the first connection region CA1 along the Y-axis direction may be set to be greater than ½ of the transistor disposition pitch TRp. Similarly, the width WCA2 of the second connection region CA2 along the Y-axis direction may be set to be greater than ½ of the transistor disposition pitch TRp.

The width WEA1 along the Y-axis direction of the first midpoint region EA1 opposing the second connection region CA2 along the Y-axis direction is smaller than the width WEA2 of the second midpoint region EA2 along the Y-axis direction.

In the semiconductor device 201, the transistors not only can be multiply provided repeatedly along the Y-axis direction but also can be multiply provided repeatedly along the X-axis direction. In such a case, the transistors can be multiply provided repeatedly in the X-axis direction two at a time by the two transistors being disposed along the X-axis direction at symmetric positions mirrored around the Y-axis direction.

In other words, as illustrated in FIG. 2, the first circuit unit 210 may further include a fifth interconnect S5 provided above the major surface 205a to extend in the first direction and a sixth interconnect S6 provided above the major surface 205a to extend in the first direction, where the sixth interconnect S6 is juxtaposed to the fifth interconnect S5 along the second direction from the first interconnect S1 toward the second interconnect S2. Herein, this includes the case where one or multiple interconnects are disposed between the fifth interconnect S5 and the sixth interconnect S6.

The second circuit unit 220 may further include a seventh interconnect S7 provided above the major surface 205a to extend in the first direction and an eighth interconnect S8 provided above the major surface 205a to extend in the first direction, where the eighth interconnect S8 is juxtaposed to the seventh interconnect S7 along the second direction from the first interconnect S1 toward the second interconnect S2. Herein, this includes the case where one or multiple interconnects are disposed between the seventh interconnect S7 and the eighth interconnect S8.

The intermediate unit 230 may further include a third transistor TR3 and a fourth transistor TR4. The insulating layer 261 also may be provided between the third transistor TR3 and the fourth transistor TR4. The insulating layer 261 also may be provided between the first transistor TR1 and the third transistor TR3 and between the second transistor TR2 and the fourth transistor TR4.

The third transistor TR3 is provided in the major surface 205a on the side of the first one diffusion layer DA1 opposite to the first gate electrode G01 and is juxtaposed to the first transistor TR1 along the first direction.

The fourth transistor TR4 is provided in the major surface 205a juxtaposed to the third transistor TR3 along the second direction and juxtaposed to the second transistor TR2 along the first direction.

As illustrated in FIG. 1 and FIG. 2, the third transistor TR3 includes a third one diffusion layer DA3 and a third other diffusion layer DB3 provided in the major surface 205a and a third gate electrode G03. The third one diffusion layer DA3 and the third other diffusion layer DB3 oppose each other along the first direction. The third gate electrode G03 is provided above the major surface 205a between the third one diffusion layer DA3 and the third other diffusion layer DB3 to extend in the second direction. In the first direction, the third one diffusion layer DA3 is disposed between the third gate electrode G03 and the first gate electrode G01.

The fourth transistor TR4 includes a fourth one diffusion layer DA4 and a fourth other diffusion layer DB4 provided in the major surface 205a and a fourth gate electrode G04. The fourth one diffusion layer DA4 and the fourth other diffusion layer DB4 oppose each other in the first direction. The fourth gate electrode G04 is provided above the major surface 205a between the fourth one diffusion layer DA4 and the fourth other diffusion layer DB4 to extend in the second direction. The fourth gate electrode G04 extends in the second direction juxtaposed to the third gate electrode G03 along the second direction and is connected to the third gate electrode G03. The fourth one diffusion layer DA4 is disposed between the fourth gate electrode G04 and the second gate electrode G02.

The third one diffusion layer DA3 includes a third connection region CA3, a third midpoint region EA3, and a third inner connection region CAI3. The third midpoint region EA3 is provided on the third gate electrode G03 side of the third connection region CA3 and is connected to the third connection region CA3. A width WEA3 of the third midpoint region EA3 along the second direction is narrower than a width WCA3 of the third connection region CA3 along the second direction. The third inner connection region CAI3 is provided inside the third connection region CA3 and is electrically connected to the fifth interconnect S5. In this specific example, a fifth contact plug CP5 extending in the Z-axis direction is provided in the third inner connection region CAI3; and the third inner connection region CAI3 is electrically connected to the fifth interconnect S5 via the fifth contact plug CP5.

The third other diffusion layer DB3 is electrically connected to the seventh interconnect S7. In this specific example, a seventh contact plug CP7 extending in the Z-axis direction is provided in the third other diffusion layer DB3; and the third other diffusion layer DB3 is electrically connected to the seventh interconnect S7 via the seventh contact plug CP7.

The width along the second direction of the boundary between the third gate electrode G03 and the third other diffusion layer DB3 is substantially equal to the width along the second direction of the boundary between the third gate electrode G03 and the third midpoint region EA3. For example, the former is not less than 80% and not more than 120% of the latter.

The fourth one diffusion layer DA4 includes a fourth connection region CA4, a fourth midpoint region EA4, and a fourth inner connection region CAI4. The fourth midpoint region EA4 is provided on the fourth gate electrode G04 side of the fourth connection region CA4 and is connected to the fourth connection region CA4. A width WEA4 of the fourth midpoint region EA4 along the second direction is narrower than a width WCA4 of the fourth connection region CA4 along the second direction. The fourth inner connection region CAI4 is provided inside the fourth connection region CA4 and is electrically connected to the sixth interconnect S6. In this specific example, a sixth contact plug CP6 extending in the Z-axis direction is provided in the fourth inner connection region CAI4; and the fourth inner connection region CAI4 is electrically connected to the sixth interconnect S6 via the sixth contact plug CP6.

The fourth other diffusion layer DB4 is electrically connected to the eighth interconnect S8. In this specific example, an eighth contact plug CP8 extending in the Z-axis direction is provided in the fourth other diffusion layer DB4; and the fourth other diffusion layer DB4 is electrically connected to the eighth interconnect S8 via the eighth contact plug CP8.

The width along the second direction of the boundary between the fourth other diffusion layer DB4 and the fourth gate electrode G04 is substantially equal to the width along the second direction of the boundary between the fourth midpoint region EA4 and the fourth gate electrode G04. For example, the former is not less than 80% and not more than 120% of the latter. For example, the width along the second direction of the boundary between the fourth midpoint region EA4 and the fourth gate electrode G04 is greater than the width along the second direction of the fourth midpoint region EA4 at the central portion in the first direction. The width along the second direction of the boundary between the fourth other diffusion layer DB4 and the fourth gate electrode G04 is greater than the width along the second direction of the fourth midpoint region EA4 at the central portion in the first direction. As a result, the characteristic fluctuation of the fourth transistor TR4 can be suppressed. The width of the fourth other diffusion layer DB4 along the second direction is substantially equal to the width of the third other diffusion layer DB3 along the second direction. For example, the former is not less than 80% and not more than 120% of the latter.

The impurity type of the third connection region CA3, the fourth connection region CA4, the third midpoint region EA3, the fourth midpoint region EA4, the third inner connection region CAI3, and the fourth inner connection region CAI4 is the first conductivity type.

The impurity concentration of the third inner connection region CAI3 and the fourth inner connection region CAI4 is higher than the impurity concentration of the third connection region CA3 and the fourth connection region CA4. In other words, the third inner connection region CAI3 and the fourth inner connection region CAI4 are, for example, $n^+$ layers; and the third connection region CA3 and the fourth connection region CA4 are $n^-$ layers. The third midpoint region EA3 and the fourth midpoint region EA4 are $n^-$ layers.

On the other hand, the third other diffusion layer DB3 and the fourth other diffusion layer DB4 have the first conductivity type. The third other diffusion layer DB3 and the fourth other diffusion layer DB4 are, for example, $n^+$ layers.

In the semiconductor device 201, a distance d3 along the first direction from a boundary B03 between the third connection region CA3 and the third midpoint region EA3 to an edge GE3 of the third gate electrode G03 on the third connection region CA3 side is shorter than a distance d4 along the first direction from a boundary B04 between the fourth connection region CA4 and the fourth midpoint region EA4 to an edge GE4 of the fourth gate electrode G04 on the fourth connection region CA4 side.

Here, in some cases, the connection between the third connection region CA3 and the third midpoint region EA3 is smooth; and the width along the second direction between the third connection region CA3 and the third midpoint region EA3 changes continuously. Also, in some cases, the connection between the fourth connection region CA4 and the fourth midpoint region EA4 is smooth; and the width along the second direction between the fourth connection region CA4 and the fourth midpoint region EA4 changes continuously. In such cases, the boundaries B03 and B04 are taken as substantially the central portion in the first direction from the portion where the change of the width along the second direction starts to the portion where the change of the width along the second direction ends.

In other words, in the semiconductor device 201 as illustrated in FIG. 1, the third transistor TR3 and the fourth transistor TR4 are multiply provided alternately along the Y-axis direction. In such a case, by disposing the fourth connection region CA4, which has a wide width along the Y-axis direction and is distal to the fourth gate electrode G04, and the third connection region CA3, which has a wide width along the Y-axis direction and is proximal to the third gate electrode G03, alternately along the Y-axis direction, the fourth midpoint region EA4, which has a narrow width along the Y-axis direction, and the third connection region CA3 can oppose each other along the Y-axis direction. In other words, the third connection region CA3 and the fourth connection region CA4, which have wide Y-axis direction widths, are not juxtaposed to each other along the Y-axis direction. Thereby, the spacing along the Y-axis direction between the third transistor TR3 and the fourth transistor TR4 can be reduced; and the disposition pitch of the transistors along the Y-axis direction can be reduced.

For example, in such a case as well, the width WCA3 of the third connection region CA3 along the Y-axis direction and the width WCA4 of the fourth connection region CA4 along the Y-axis direction may be set to be greater than ½ of the transistor disposition pitch TRp.

Thereby, a semiconductor device can be provided in which high reliability is realized while the chip surface area is reduced.

The width WEA4 along the Y-axis direction of the fourth midpoint region EA4 opposing the third connection region CA3 along the Y-axis direction is smaller than the width WEA3 of the third midpoint region EA3 along the Y-axis direction.

An example of the configuration of the second transistor TR2 will now be described as an example of the configuration of the transistor included in the intermediate unit 230.

FIG. 3 is a cross-sectional view along line A1-A2 of FIG. 1 and is a cross-sectional view along line A1-A2 of FIG. 2.

As illustrated in FIG. 3, for example, the second one diffusion layer DA2 and the second other diffusion layer DB2 are provided in the surface (the major surface 205a) of a semiconductor layer 251 (e.g., a p-type semiconductor layer) used to form the semiconductor substrate 205. The second one diffusion layer DA2 includes the second connection region CA2 (i.e., an active area AA, e.g., an n⁻ layer), the second inner connection region CAI2 (e.g., an n⁺ layer) inside the second connection region CA2, and the second midpoint region EA2 (e.g., an n⁻ layer).

An insulating film 252 is provided on the semiconductor layer 251 between the second one diffusion layer DA2 and the second other diffusion layer DB2; a conductive layer 253 used to form a floating gate of the memory cell is provided thereon; an insulating film 254 used as an inter-gate insulating film is provided thereon; and a gate conductive layer 255 used to form a control gate of the memory cell is provided thereon. The gate conductive layer 255 is connected to the conductive layer 253 through an opening provided in the insulating film 254. The conductive layer 253 and the gate conductive layer 255 are included in the second gate electrode G02. A side face insulating film 256 is provided on the side faces of the insulating film 252, the conductive layer 253, and the gate conductive layer 255.

The insulating layer 261 (e.g., an STI) is provided on the side of the second one diffusion layer DA2 opposite to the second other diffusion layer DB2 and on the side of the second other diffusion layer DB2 opposite to the second one diffusion layer DA2. Thereby, the second transistor TR2 is separated from other transistors.

An inter-layer insulating film 257 is provided around the second transistor TR2. A contact hole is made in the inter-layer insulating film 257 at a position corresponding to the second inner connection region CAI2; and a conductive material is filled therein to form the second contact plug CP2. A contact hole is made in the inter-layer insulating film 257 at a position corresponding to the second other diffusion layer DB2; and a conductive material is filled therein to form the fourth contact plug CP4.

A conductive layer 258a and a conductive layer 258b are provided in the upper face of the inter-layer insulating film 257. The conductive layer 258a and the conductive layer 258b are in the same layer. The conductive layer 258a is connected to the second inner connection region CAI2 by the second contact plug CP2.

An inter-layer insulating film 271 is provided on the inter-layer insulating film 257, the conductive layer 258a, and the conductive layer 258b; and an upper conductive layer 272 is provided thereon. The upper conductive layer 272 is, for example, the second interconnect S2 extending from the first circuit unit 210 and is, for example, a bit line BL. The upper conductive layer 272 and the conductive layer 258a are electrically connected by, for example, a via electrode 273.

Thereby, the second inner connection region CAI2 is electrically connected to the upper conductive layer 272 (the second interconnect S2) by the second contact plug CP2, the conductive layer 258a, and the via electrode 273.

On the other hand, the second other diffusion layer DB2 is electrically connected to a not-illustrated fourth interconnect S4 via the fourth contact plug CP4 and the conductive layer 258b.

Such a configuration may be applied also to the other transistors (e.g., the first transistor TR1, the third transistor TR3, the fourth transistor TR4, etc.).

The configurations of the first to fourth connection regions CA1 to CA4 recited above may be different from each other. For example, the planar patterns (the planar patterns as viewed from the Z-axis direction) and the like of the first to fourth connection regions CA1 to CA4 may have different configurations. However, because the efficiencies of the design and the manufacturing of the semiconductor device can be increased, it is favorable to use the same planar pattern for the first to fourth connection regions CA1 to CA4. Hereinbelow, the case is described where the first to fourth connection regions CA1 to CA4 have the same planar pattern.

As illustrated in FIG. 1, flowing widths are defined: a width W1 along the Y-axis direction from the edge of the second connection region CA2 on the first transistor TR1 side to the second inner connection region CAI2, a width W2 along the Y-axis direction from the edge of the second connection region CA2 on the side opposite to the first transistor TR1 to the second inner connection region CAI2, and a width W3 of the second inner connection region CAI2 along the Y-axis direction. The total of width W1, width W2 and width W3 is the width WCA2 of the second connection region CA2 along the Y-axis direction.

Similarly, the first connection region CA1, the third connection region CA3, and the fourth connection region CA4 also have the width W1 to the width W3 recited above similar to those of the second connection region CA2.

On the other hand, the distance along the Y-axis direction from the edge of the first midpoint region EA1 on the second connection region CA2 side to the edge of the second connection region CA2 on the first midpoint region EA1 side is taken as a width W4. Another transistor similar to the first transistor TR1 is provided on the side of the second transistor TR2 opposite to the first transistor TR1; and the distance from the midpoint region of the diffusion layer of the transistor to the second connection region CA2 is taken as a width W7. The width W4 and the width W7 are the widths of the insulating layer 261 along the Y-axis direction. The distance along the Y-axis direction from the edge of the second other diffusion layer DB2 on the first other diffusion layer DB1 side to the edge of the first other diffusion layer DB1 on the second other diffusion layer DB2 side also is the width W4.

Herein, the width W1 and the width W2 may be equal to each other or may be different from each other. It is favorable in the manufacturing of the semiconductor memory device for the width W4 and the width W7 to be the same to provide regularity. Hereinbelow, the case is described where the width W1 and the width W2 are the same to simplify the description. Also, the case is described where the width W4 and the width W7 are the same.

In this embodiment, large widths W1 and W2 recited above can be maintained even in the case where the transistor disposition pitch TRp is reduced. These effects will now be described with reference to a comparative example.

Comparative Example

Figure 4:
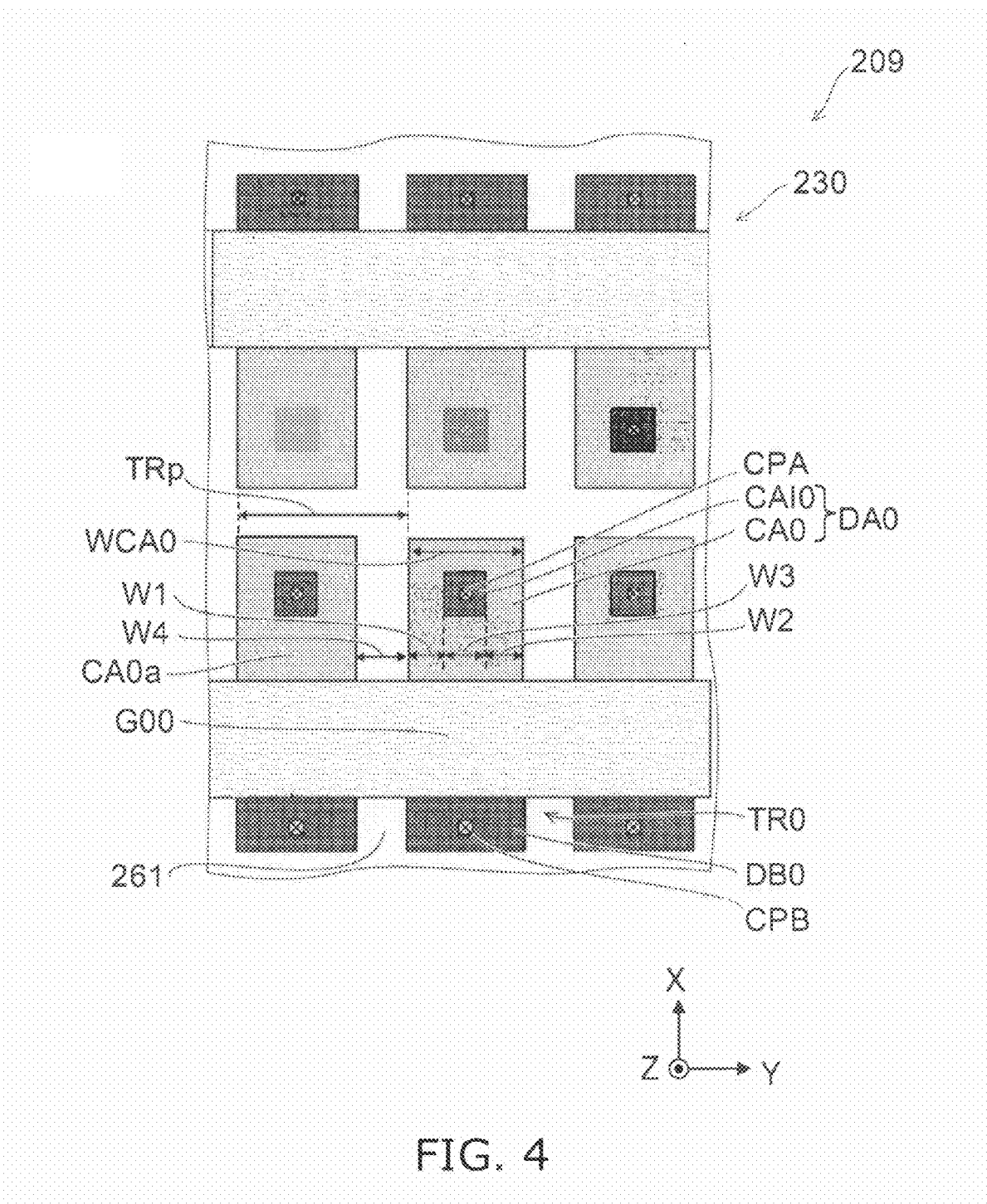
FIG. 4 is a schematic plan view illustrating the configuration of a semiconductor device of a comparative example.

FIG. 4 is a schematic plan view illustrating the configuration of a semiconductor device of a comparative example.

In the semiconductor device 209 of the comparative example as illustrated in FIG. 4, multiple transistors provided in the intermediate unit 230 have the same configuration. The configuration of one transistor TR0 will now be described.

The transistor TR0 includes one diffusion layer DA0, one other diffusion layer DB0, and a gate electrode G00 provided therebetween. The one diffusion layer DA0 and the one other diffusion layer DB0 oppose each other along the first direction. A connection region CA0 (taken to be an n⁻ layer)

having the first conductivity type is provided in the one diffusion layer DA0. An inner connection region CAI0 (taken to be an $n^+$ layer) having the first conductivity type with an impurity concentration higher than that of the connection region CA0 is provided inside the connection region CA0. One contact plug CPA is provided in the inner connection region CAI0; and the inner connection region CAI0 is electrically connected to an interconnect of the first circuit unit 210 via the one contact plug CPA. The one other diffusion layer DB0 also has the first conductivity type; one other contact plug CPB is provided in the one other diffusion layer DB0; and the one other diffusion layer DB0 is electrically connected to an interconnect of the second circuit unit 220 via the one other contact plug CPB.

A width WCA0 of the connection region CA0 along the Y-axis direction is the total of the width W1, the width W2, and the width W3. The distance from the connection region CA0 of the transistor TR0 to a connection region CA0a of another transistor juxtaposed to the transistor TR0 is the width W4. The width W4 is the distance from the edge of the connection region CA0a on the connection region CA0 side to the edge of the connection region CA0 on the connection region CA0a side. To simplify the description, the width W1 and the width W2 are taken to be the same.

In the case where the first circuit unit 210 is, for example, a memory cell array unit and the second circuit unit 220 is a sense amplifier circuit unit in the semiconductor device 209 having such a configuration, a high voltage is applied to, for example, the bit lines BL of the first circuit unit 210. For example, a high voltage of, for example, about 20 V (volts) may be applied to the bit lines during the erasing operation. On the other hand, a relatively low voltage of, for example, about 3 V may be used in the second circuit unit 220. In this case, it may be attempted to reduce the occupied surface area of the sense amplifier circuits and the like provided in the second circuit unit 220 to shrink the entire semiconductor device 209.

On the other hand, the reliability may deteriorate due to the decrease of the junction breakdown voltage when reducing the size of the connection region CA0 of the one diffusion layer DA0 to which the high voltage is applied.

Figure 5:
FIG. 5 is a graph illustrating a characteristic of the semiconductor device.

FIG. 5 is a graph illustrating a characteristic of the semiconductor device.

Namely, FIG. 5 illustrates the experimental results of the relationship between the width W1 of the connection region CA0 and a junction breakdown voltage Vj of the connection region CA0. The horizontal axis is the width W1; and the vertical axis is the junction breakdown voltage Vj. Herein, the width W1 is taken to be the same as the width W2. The width W1 is the distance from the outer edge of the active area AA (the connection region CA0) to the $n^-$ layer (the inner connection region CAI0).

As illustrated in FIG. 5, the junction breakdown voltage Vj decreases as the width W1 decreases.

On the other hand, the width W3 of the inner connection region is set not less than a constant width to ensure a stable electrical connection in the connection region CA0. Further, the width W4 (and the width W7) of the insulating layer 261 is set not less than a constant width to separate the juxtaposed transistors from each other.

For example, as the pitch of the bit lines BL is reduced, the transistor disposition pitch TRp of the transistors TR0 connected to the bit lines BL also is reduced accordingly. In other words, for example, in a NAND nonvolatile semiconductor memory device, it is favorable for the design for the sense amplifiers to be disposed at a pitch 16 times the pitch of the bit lines BL, 32 times the pitch of the bit lines BL, etc. Therefore, it is favorable for the transistor disposition pitch TRp of the transistors TR0 provided between the bit lines BL and the sense amplifiers to similarly be set to a pitch of 16 times the pitch of the bit lines BL, 32 times the pitch of the bit lines BL, etc. In the case where the transistor disposition pitch TRp is set to be different from the pitch of the sense amplifiers, the configuration of the upper layer interconnects, for example, that connect the transistors TR0 to the sense amplifiers becomes complex; and as a result, the chip surface area of the semiconductor device undesirably increases.

Thus, as the pitch of the bit lines BL is reduced, the transistor disposition pitch TRp is reduced. In the semiconductor device 209 of the comparative example, when the width WCA0 of the connection region CA0 is reduced accordingly with the transistor disposition pitch TRp, the width W1 and the width W2 are reduced because the width W3 is set to be not less than a constant; and a decrease of the junction breakdown voltage Vj may occur which leads to deterioration of the reliability. On the other hand, in the case where the width W3 is reduced, the contact resistance increases; and a stable electrical connection cannot be ensured.

Conversely, in the semiconductor device 201 according to this embodiment, the reduction of the width W1 when the transistor disposition pitch TRp is reduced can be more relaxed than that of the comparative example. Because the first connection region CA1 of the first transistor TR1 and the second connection region CA2 of the second transistor TR2 are disposed in a zigzag configuration. Similarly, the width W3 can be ensured at not less than a constant. In other words, the width W4 of the insulating layer 261 can be sufficiently ensured even in the case where the width WCA2 of the second connection region CA2 is large. Because the second connection region CA2, which has the large width WCA2 along the Y-axis direction, and the first midpoint region EA1, which has the small width WEA1 along the Y-axis direction, oppose each other along the Y-axis direction.

Thus, according to the semiconductor device 201, a semiconductor device can be provided in which high reliability is realized while the chip surface area is reduced.

Figure 6:
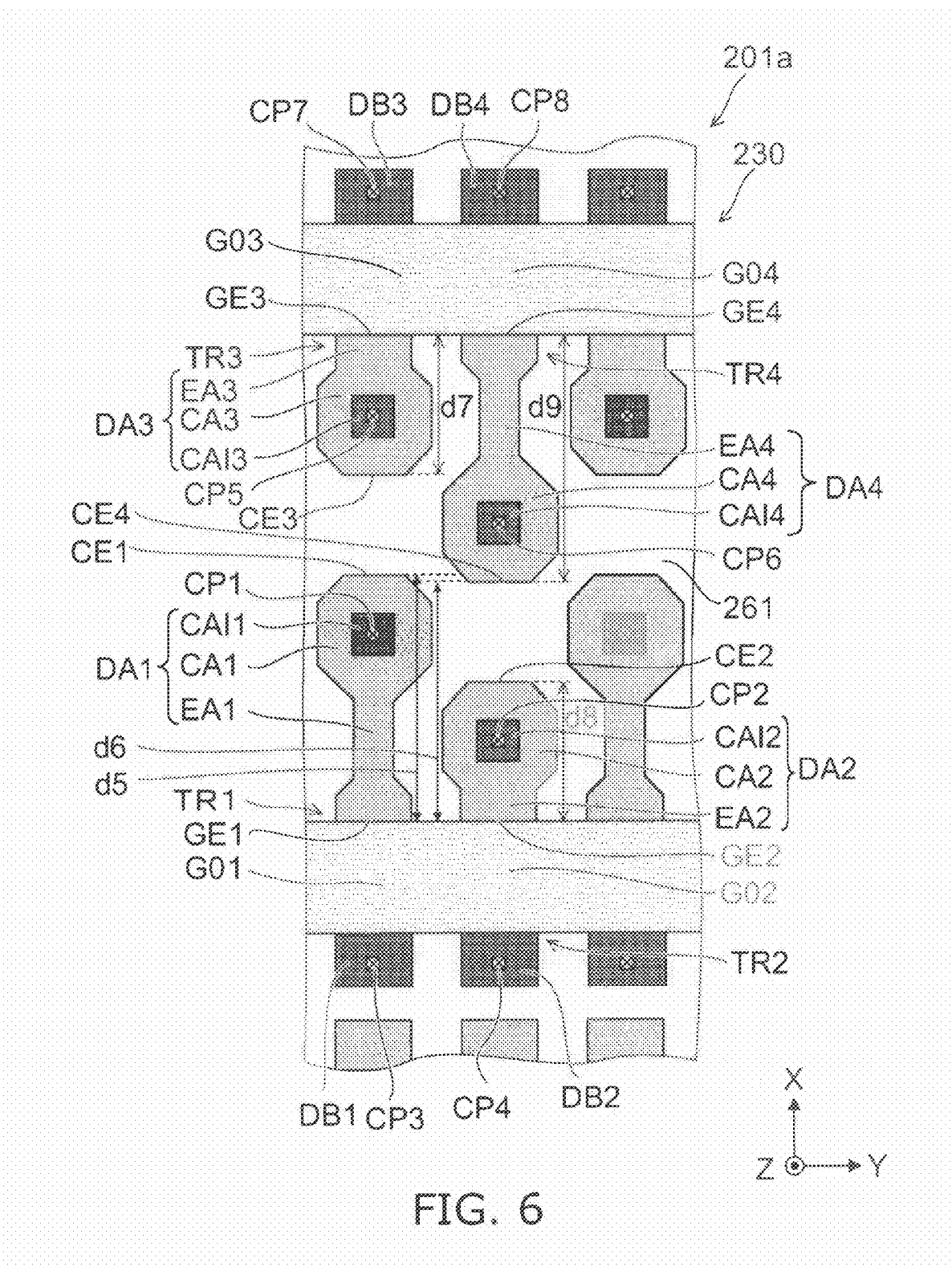
FIG. 6 is a schematic plan view illustrating the configuration of another semiconductor device according to the first embodiment.

FIG. 6 is a schematic plan view illustrating the configuration of another semiconductor device according to the first embodiment. In the semiconductor device 201a according to this embodiment as illustrated in FIG. 6, the corners of each of the first to fourth connection regions CA1 to CA4 are sides oblique with respect to the X-axis direction.

For example, the mutually proximal corner portions of the first connection region CA1 and the second connection region CA2 oppose each other in a direction oblique with respect to the X-axis direction. In other words, the portion of the first connection region CA1 proximal to the second connection region CA2 along a direction oblique with respect to the X-axis direction is perpendicular to the direction from the first connection region CA1 (e.g., the center thereof) toward the second connection region CA2 (e.g., the center thereof). Similarly, the portion of the second connection region CA2 proximal to the first connection region CA1 along a direction oblique with respect to the X-axis direction is perpendicular to the direction from the first connection region CA1 (e.g., the center thereof) toward the second connection region CA2 (e.g., the center thereof). For the first connection region CA1 and the second connection region CA2, it can be said that the sides oblique with respect to the X-axis direction are parallel to each other.

The mutually proximal corner portions of the first connection region CA1 and the fourth connection region CA4 oppose each other in a direction oblique with respect to the X-axis direction. In other words, the portion of the first connection region CA1 proximal to the fourth connection region CA4 along a direction oblique with respect to the X-axis direction is perpendicular to the direction from the first connection region CA1 (e.g., the center thereof) toward the fourth connection region CA4 (e.g., the center thereof). Similarly, the portion of the fourth connection region CA4 proximal to the first connection region CA1 along a direction oblique with respect to the X-axis direction is perpendicular to the direction from the first connection region CA1 (e.g., the center thereof) toward the fourth connection region CA4 (e.g., the center thereof). For the first connection region CA1 and the fourth connection region CA4, it can be said that the sides oblique with respect to the X-axis direction are parallel to each other.

Thus, by forming the corner portions of, for example, the first connection region CA1 and the second connection region CA2 and the corner portions of the first connection region CA1 and the fourth connection region CA4, which are mutually proximal in directions oblique with respect to the X-axis direction, to be oblique to the X-axis direction as recited above. Then, the distance between such corner portions can be increased; and, for example, the distance between the first inner connection region CAI1 and the second inner connection region CAI2 can be reduced and the distance between the first inner connection region CAI1 and the fourth inner connection region CAI4 can be reduced.

As a result, for example, the distance between the first transistor TR1 and the third transistor TR3 and the distance between the second transistor TR2 and the fourth transistor TR4 of the semiconductor device 201a can be further shorter. In other words, the distance along the X-axis direction of the transistor formation region can be reduced. Further, the electric field concentration in the corner portions can be mitigated by the corner portions having configurations such as those recited above. As a result, it is possible to increase the junction breakdown voltage of the respective transistors.

As illustrated in FIG. 6, in the X-axis direction, a distance d5 from an edge CE1 of the first connection region CA1 on the side opposite to the first gate electrode G01 to the edge GE1 of the first gate electrode G01 on the first connection region CA1 side is longer than a distance d7 from an edge CE3 of the third connection region CA3 on the side opposite to the third gate electrode G03 to the edge GE3 of the third gate electrode G03 on the third connection region CA3 side.

On the other hand, in the X-axis direction, a distance d8 from an edge CE2 of the second connection region CA2 on the side opposite to the second gate electrode G02 to the edge GE2 of the second gate electrode G02 on the second connection region CA2 side is shorter than a distance d9 from an edge CE4 of the fourth connection region CA4 on the side opposite to the fourth gate electrode G04 to the edge GE4 of the fourth gate electrode G04 on the fourth connection region CA4 side.

Thus, it also can be said that the first connection region CA1 to the fourth connection region CA4 are disposed in a zigzagging staggered configuration along the X-axis direction and the Y-axis direction.

Further, as illustrated in FIG. 6, in the X-axis direction, the distance d5 from the edge CE1 of the first connection region CA1 on the side opposite to the first gate electrode G01 to the edge GE1 of the first gate electrode G01 on the first connection region CA1 side is longer than a distance d6 from the edge CE4 of the fourth connection region CA4 on the side opposite to the fourth gate electrode G04 to the edge GE2 of the second gate electrode G02 on the fourth connection region CA4 side. In other words, the first connection region CA1 and the fourth connection region CA4 have portions opposing each other along the Y-axis direction. Thereby, the distance along the X-axis direction of the transistor formation region can be reduced.

Figure 7:
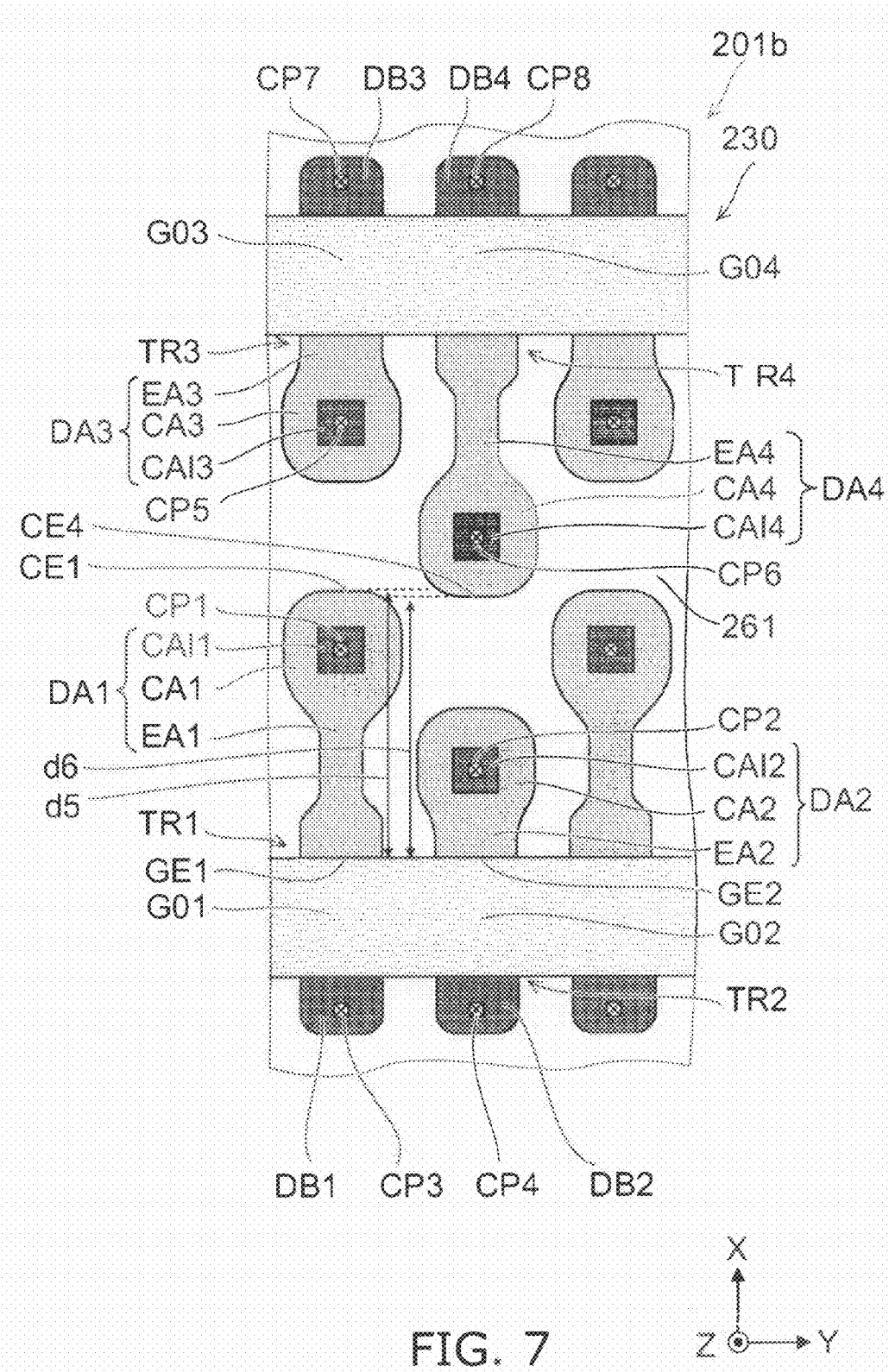
FIG. 7 is a schematic plan view illustrating the configuration of another semiconductor device according to the first embodiment.

FIG. 7 is a schematic plan view illustrating the configuration of further another semiconductor device according to the first embodiment. In the further another semiconductor device 201b according to this embodiment as illustrated in FIG. 7, the corners of each of the first to fourth connection regions CA1 to CA4 have curved configurations. The planar configurations of the first to fourth connection regions CA1 to CA4 may be substantially circular (including flattened circular).

Thus, by using corner portions having curves, the distances between the corner portions between, for example, the first connection region CA1 and the second connection region CA2 and between the first connection region CA1 and the fourth connection region CA4 are increased. Further, the electric field concentration at the corner portions is mitigated. Thereby, in the semiconductor device 201b, the distance along the X-axis direction of the transistor formation region can be reduced.

In such a case as well, in the X-axis direction, the distance d5 from the edge CE1 of the first connection region CA1 on the side opposite to the first gate electrode G01 to the edge GE1 of the first gate electrode G01 on the first connection region CA1 side is longer than the distance d6 from the edge CE4 of the fourth connection region CA4 on the side opposite to the fourth gate electrode G04 to the edge GE2 of the second gate electrode G02 on the fourth connection region CA4 side.

First Example

NAND flash memory (a nonvolatile semiconductor memory device) which is a semiconductor device of a first example according to the first embodiment will now be described.

Figure 8:
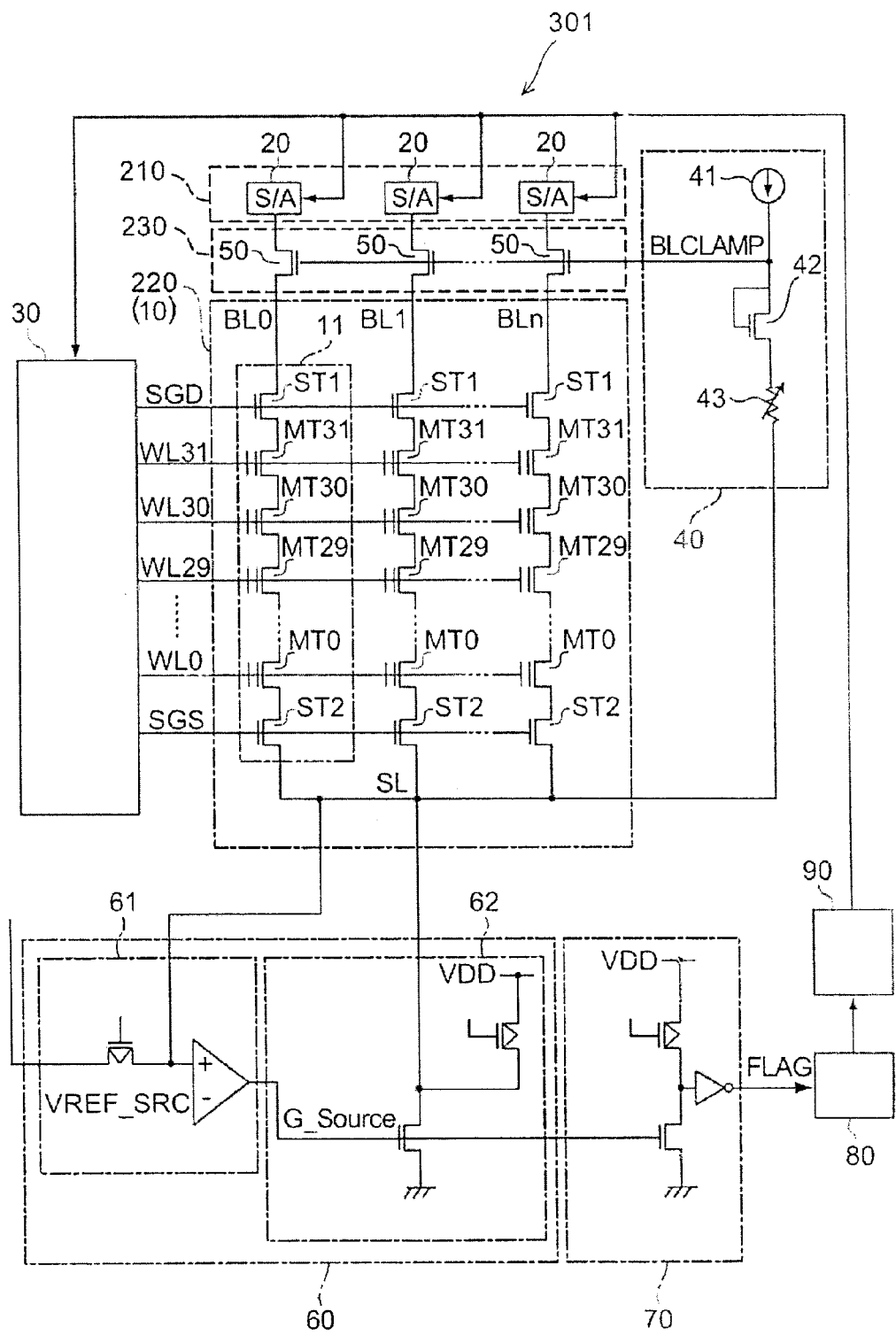
FIG. 8 is a schematic view illustrating the configuration of the semiconductor device according to the first example.

FIG. 8 is a schematic view illustrating the configuration of the semiconductor device according to the first example.

Figure 9:
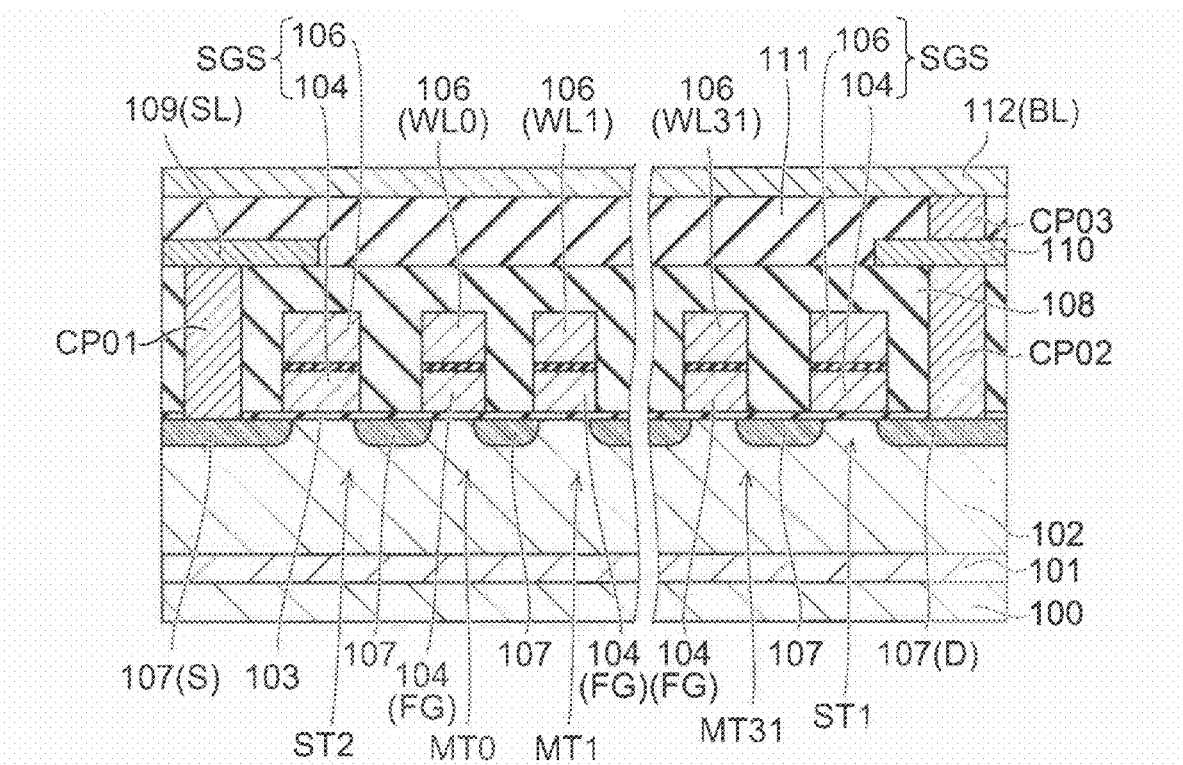
FIG. 9 is a schematic cross-sectional view illustrating the configuration of a portion of the semiconductor device according to the first example.

FIG. 9 is a schematic cross-sectional view illustrating the configuration of a portion of the semiconductor device according to the first example. Namely, FIG. 9 illustrates the configuration of the memory cell array included in the first circuit unit 210 of the semiconductor device and is a cross-sectional view of the memory cell array when cut by a plane including the first direction (the X-axis direction) and the third direction (the Z-axis direction).

Figure 10:
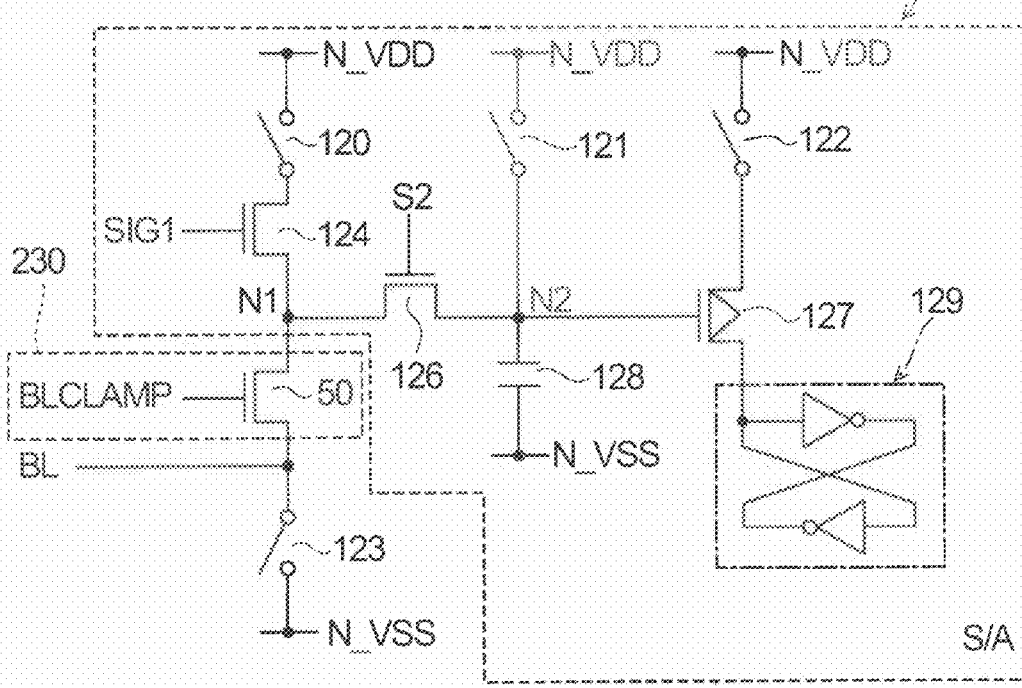
FIG. 10 is a circuit diagram illustrating the configuration of the sense amplifier unit included in the semiconductor device according to the first example.

FIG. 10 is a circuit diagram illustrating the configuration of the sense amplifier unit included in the semiconductor device according to the first example.

As illustrated in FIG. 8, the nonvolatile semiconductor memory device 301 (the NAND flash memory) which is the semiconductor device according to the first example includes a memory cell array 10, sense amplifiers 20, a row decoder 30, a bit line driver 40, MOS transistors 50, a source line control circuit 60, a detection circuit 70, a sequencer 80, and a core control circuit 90.

The memory cell array 10 corresponds to the first circuit unit 210; the sense amplifiers 20 correspond to the second circuit unit 220; and the MOS transistors 50 correspond to the intermediate unit 230.

The memory cell array 10 includes multiple memory cell units 11 (memory cell strings). Each of the memory cell units 11 includes, for example, 32 memory cell transistors MT0 to MT31, a selection transistor ST1, and a selection transistor ST2. Except when the memory cell transistors MT0 to MT31 are discriminated hereinbelow, the memory cell transistors MT0 to MT31 are referred to collectively as the memory cell transistors MT.

The memory cell transistor MT has, for example, a stacked gate structure including a charge storage layer (e.g., a floating gate) provided on a semiconductor substrate with a gate insulating film interposed therebetween and a control gate provided on the charge storage layer with an inter-gate insulating film interposed therebetween.

The number of the memory cell transistors MT in the memory cell unit 11 is not limited to 32. The number may be 8, 16, 64, 128, 256, etc., and is not limited.

The source and the drain are shared by juxtaposed memory cell transistors MT. The multiple memory cell transistors MT are provided between the selection transistor ST1 and the selection transistor ST2; and the multiple memory cell transistors are disposed such that the current paths of the multiple memory cell transistors are connected in series. The drain at one end of the multiple memory cell transistors MT connected in series is connected to the source of the selection transistor ST1; and the source at the other end is connected to the drain of the selection transistor ST2.

The control gates of the memory cell transistors MT in the same row have a common connection to one of word lines WL0 to W31; and the gates of the selection transistor ST1 and the selection transistor ST2 of the memory cells in the same row have a common connection to a select gate line SGD and a select gate line SGS, respectively. To simplify the description hereinbelow, the word lines WL0 to WL31 may be called simply the word lines WL.

The drains of the selection transistors ST1 in the same column have a common connection to bit lines BL0 to BLm (where m is a natural number). The bit lines BL0 to BLm also may be called simply the bit lines BL.

The sources of the selection transistors ST2 have a common connection to a source line SL. Both the selection transistor ST1 and the selection transistor ST2 are not always necessary. Only one selected from the two may be provided as long as the memory cell unit 11 can be selected.

Although only one row of the memory cell units 11 is illustrated in FIG. 8, multiple rows of the memory cell units 11 may be provided in the memory cell array 10. In such a case, the memory cell units 11 in the same column may be connected to the same bit line BL.

FIG. 9 corresponds to a cross-sectional view along the X-axis direction (the bit line BL direction) of the memory cell unit 11.

In the memory cell unit 11 as illustrated in FIG. 9, for example, an n-type well region 101 is provided in the surface region of a p-type semiconductor substrate 100; and a p-type well region 102 is provided in the surface region of the n-type well region 101. A gate insulating film 103 is provided on the p-type well region 102; and the gate electrodes of the memory cell transistors MT and the selection transistors ST1 and ST2 are provided on the gate insulating film 103.

The gate electrodes of the memory cell transistors MT and the selection transistors ST1 and ST2 include a polycrystalline silicon layer 104 provided on the gate insulating film 103, an inter-gate insulating film provided on the polycrystalline silicon layer 104, and a polycrystalline silicon layer 106 provided on the inter-gate insulating film.

The inter-gate insulating film may include, for example, a silicon oxide film; a stacked structure of a silicon oxide film and a silicon nitride film such as an ON film, a NO film, an ONO film or a stacked structure including the same; or a stacked structure of a silicon oxide film or a silicon nitride film stacked with a film of $TiO_2$, $HfO_2$, $Al_2O_3$, $HfAlO_x$, or HfAlSi. The gate insulating film 103 functions as a tunneling insulating film.

In the memory cell transistor MT, the polycrystalline silicon layer 104 functions as a floating gate (FG). The polycrystalline silicon layers 106 juxtaposed to each other along the direction orthogonal to the bit lines BL have a common connection; and the polycrystalline silicon layer 106 functions as a control gate (the word line WL).

For the selection transistors ST1 and ST2, the polycrystalline silicon layers 104 and 106 juxtaposed to each other along the word line direction have common connections. The polycrystalline silicon layers 104 and 106 function as the select gate lines SGS and SGD. Only the polycrystalline silicon layer 104 may function as the select gate line. In such a case, the potential of the polycrystalline silicon layer 106 of the selection transistors ST1 and ST2 may be a constant potential or may be in a floating state.

An $n^+$-type impurity diffusion layer 107 is provided in the surface of the semiconductor substrate 100 positioned between the gate electrodes. The impurity diffusion layer 107 is shared by the transistors juxtaposed to each other and functions as a source (S) or a drain (D). The region between the juxtaposed source and drain functions as a channel region used as a movement region for electrons. The MOS transistors are formed of these gate electrodes, impurity diffusion layers 107, and channel regions to form the memory cell transistors MT and the selection transistors ST1 and ST2.

An inter-layer insulating film 108 is provided on the semiconductor substrate 100 to cover the memory cell transistors MT and the selection transistors ST1 and ST2. A contact plug CP01 is provided in the inter-layer insulating film 108 to reach the impurity diffusion layer 107 (the source) of the selection transistor ST2 of the source side.

A metal interconnect layer 109 connected to the contact plug CP01 is provided on the inter-layer insulating film 108. The metal interconnect layer 109 functions as a portion of the source line SL. A contact plug CP02 is provided in the inter-layer insulating film 108 to reach the impurity diffusion layer 107 (the drain) of the selection transistor ST1 of the drain side. A metal interconnect layer 110 connected to the contact plug CP02 is provided on the inter-layer insulating film 108.

An inter-layer insulating film 111 is provided on the inter-layer insulating film 108 to cover the metal interconnect layers 109 and 110. A contact plug CP03 is provided in the inter-layer insulating film 111 to reach the metal interconnect layer 110. A metal interconnect layer 112 having a common connection to the multiple contact plugs CP03 is provided on the inter-layer insulating film 111. The metal interconnect layer 112 functions as the bit line BL.

The row decoder 30 illustrated in FIG. 8 applies voltages to the select gate lines SGD and SGS and the word lines WL during the programming operation, the read-out operation, and the erasing of data.

Each of the MOS transistors 50 disposed in the intermediate unit 230 is connected to the bit line BL and the sense amplifier 20. These MOS transistors 50 correspond to the first transistor TR1 to the fourth transistor TR4, respectively, described in regard to the first embodiment. In other words, one terminal of the current path of each of the MOS transistors 50 is connected to the corresponding bit line BL; and the other terminal of the current path is connected to the corresponding sense amplifier 20. A voltage BLCLAMP is applied to the gates of the MOS transistors 50. The bit lines BL and the sense amplifiers 20 are electrically connected by the MOS transistors 50 being switched to the ON state.

The bit line driver 40 applies the voltage BLCLAMP to the gates of the MOS transistors 50. The MOS transistors 50 are switched to the ON state by the bit line driver 40 applying the voltage BLCLAMP. The bit line driver 40 includes a current source circuit 41, an n-channel MOS transistor 42, and a variable resistance element 43. A description of the details of the bit line driver 40 is omitted.

During the data read out, each of the sense amplifiers 20 senses and amplifies the data read from the memory cell transistor MT by the bit line BL. During the programming of data, each of the sense amplifiers 20 transfers the program data to the corresponding bit line BL.

As illustrated in FIG. 10, the sense amplifier 20 includes switch elements 120 to 123, n-channel MOS transistors 124 and 126, a p-channel MOS transistor 127, a capacitor 128, and a latch circuit 129.

One terminal of the current path of the MOS transistor 124 is connected to a node N_VDD via the switch element 120; the other terminal is connected to a node N1; and a signal SIG1 is input to the gate. The node N1 is connected to the bit line BL via the current path of the MOS transistor 50.

One terminal of the current path of the MOS transistor 126 is connected to the node N1; the other terminal is connected to a node N2; and a signal S2 is provided to the gate. The node N2 is connected to the node N_VDD via a switch element 121. One electrode of the capacitor 128 is connected to the node N2; and the other electrode is connected to a node N_VSS.

One terminal of the current path of the MOS transistor 127 is connected to the node N_VDD via a switch element 122; the other terminal is connected to the latch circuit 129; and the gate is connected to the node N2. The switch element 123 connects the bit line BL to the node N_VSS according to the data retained by the latch circuit 129. There are cases where the switch element 123 is disposed in the second circuit unit 220. In such a case, the switch element 123 is included in the second circuit unit 220.

The node N_VDD functions as the power source voltage node of the sense amplifier 20; and a voltage of, for example, (VDD+VREF_SRC) is applied thereto. The voltage VDD is an internal power source of the flash memory (e.g., 1.5 V); and the voltage VREF_SRC is the voltage applied to the source line SL by the source line control circuit 60. The node N_VSS functions as the grounding node of the sense amplifier 20; and a voltage of, for example, (VSS+VREF_SRC) is applied thereto. The voltage VSS is the grounding potential (0 V (volts)).

As illustrated in FIG. 8, the source line control circuit 60 controls the potential of the source line SL. As illustrated in FIG. 8, the source line control circuit 60 includes a voltage comparison unit 61 and a voltage control unit 62. A description of the details of the voltage comparison unit 61 and the voltage control unit 62 is omitted.

The detection circuit 70 detects the overall total of the cell current flowing in the source line SL based on the potential of a node G_Source. Then, the detection circuit 70 determines whether the overall total is larger or smaller than a reference current and outputs the determination result as flag data FLAG. A description of the details of the detection circuit 70 is omitted.

In the nonvolatile semiconductor memory device 301 having such a configuration, the first circuit unit 210 (the memory cell array 10) may further include, in addition to the first interconnect S1 and the second interconnect S2, a first memory string including multiple first memory cell transistors juxtaposed in the first direction and a second memory string including multiple second memory cell transistors juxtaposed along the first direction and juxtaposed to the first memory string along the second direction.

The first interconnect S1 is a first bit line electrically connected to the multiple first memory cell transistors of the first memory string; and the second interconnect S2 is a second bit line electrically connected to the multiple second memory cell transistors of the second memory string.

The second circuit unit 220 further includes, in addition to the third interconnect S3 and the fourth interconnect S4, a first sense amplifier electrically connected to the third interconnect S3 to identify the data stored in the multiple first memory cell transistors of the first memory string and a second sense amplifier electrically connected to the fourth interconnect S4 to identify the data stored in the multiple second memory cell transistors of the second memory string.

The configuration illustrated in FIG. 1 and FIG. 2, FIG. 6, or FIG. 7 can be applied to the MOS transistors 50, i.e., the intermediate unit 230. In other words, the bit lines BL of the memory cell array 10 are the first interconnect S1, the second interconnect S2, the fifth interconnect S5, and the sixth interconnect S6; and the interconnects connected to the multiple sense amplifiers 20 are the third interconnect S3, the fourth interconnect S4, the seventh interconnect S7, and the eighth interconnect S8, respectively. The MOS transistors 50 are the first to fourth transistors TR1 to TR4.

By employing the configuration according to this embodiment in the nonvolatile semiconductor memory device 301, the occupied width of the transistor formation region (in this specific example, the region where the MOS transistors 50 are formed) can be reduced; and high reliability can be realized while the chip surface area is reduced.

Second Embodiment

The configurations of the transistors applied to a semiconductor device 202 according to a second embodiment include, for example, one sense amplifier connected to two bit lines BL.

Figure 11:
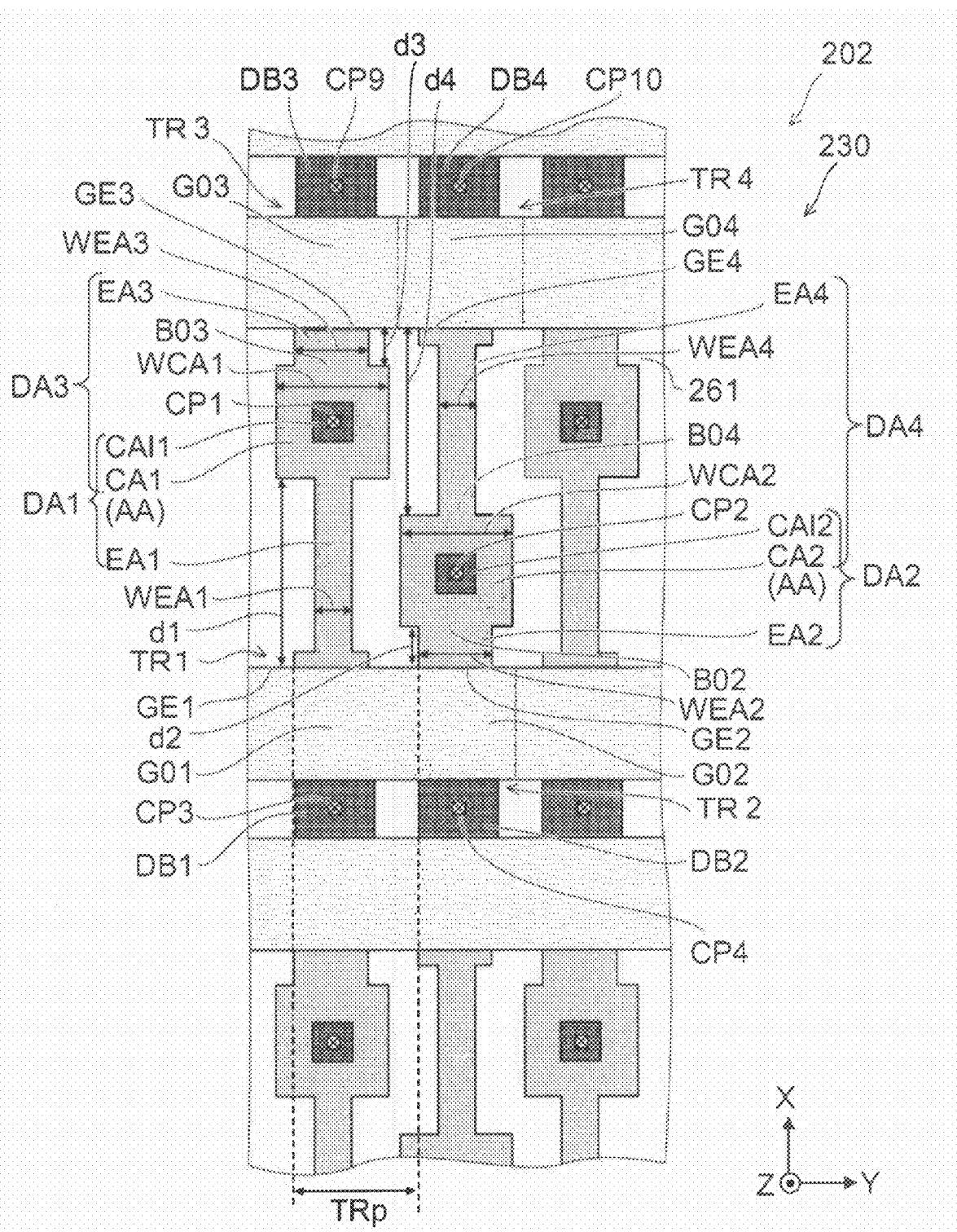
FIG. 11 is a schematic plan view illustrating the configuration of the semiconductor device according to the second embodiment.

FIG. 11 is a schematic plan view illustrating the configuration of the semiconductor device according to the second embodiment.

Figure 12:
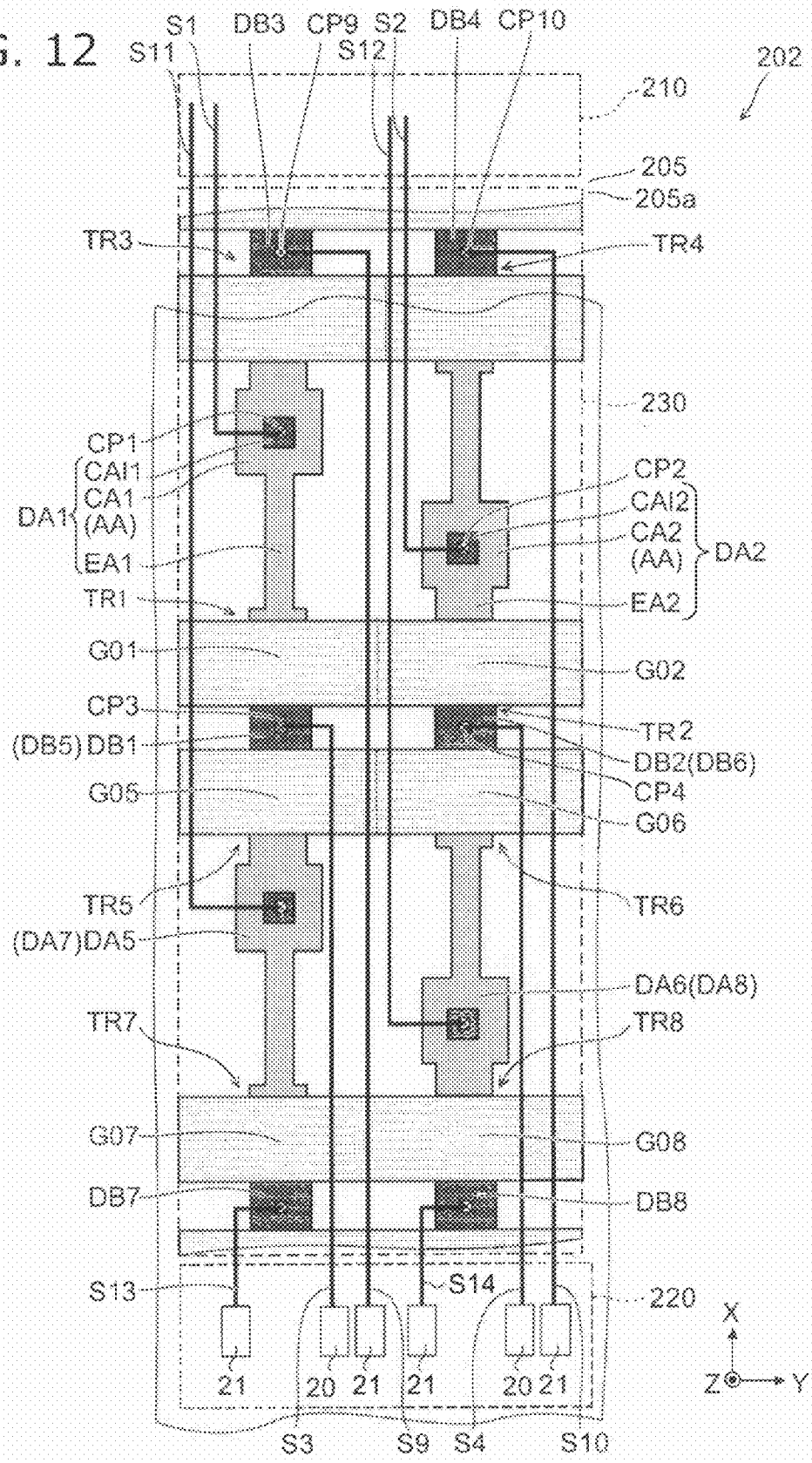
FIG. 12 is a schematic view illustrating the configuration of the semiconductor device according to the second embodiment.

FIG. 12 is a schematic view illustrating the configuration of the semiconductor device according to the second embodiment.

Namely, FIG. 12 illustrates the connectional relationship of the interconnects of the semiconductor device 202. Accordingly, the scale of the planar configuration, etc., of FIG. 12 is different from the actual values.

As illustrated in FIG. 11 and FIG. 12, the first circuit unit 210, the second circuit unit 220, and the intermediate unit 230 are provided in the semiconductor device 202 as well.

The first circuit unit 210 includes the first interconnect S1 and the second interconnect S2 described above. The second circuit unit 220 includes the third interconnect S3 and the fourth interconnect S4 described above.

The second circuit unit 220 further includes a ninth interconnect S9 provided above the major surface 205a to extend in the first direction (the X-axis direction) and a tenth interconnect S10 provided above the major surface 205a to extend in the first direction, where the tenth interconnect S10 is juxtaposed to the ninth interconnect S9 along the second direction (the Y-axis direction) from the first interconnect S1 toward the second interconnect S2.

The second circuit unit 220 further includes an eleventh interconnect S11 provided above the major surface 205a to extend in the first direction (the X-axis direction) and a twelfth interconnect S12 provided above the major surface 205a to extend in the first direction, where the twelfth interconnect S12 is juxtaposed to the eleventh interconnect S11 along the second direction (the Y-axis direction) from the first interconnect S1 toward the second interconnect S2.

The second circuit unit 220 further includes a thirteenth interconnect S13 provided above the major surface 205a to extend in the first direction (the X-axis direction) and a fourteenth interconnect S14 provided above the major surface 205a to extend in the first direction, where the fourteenth interconnect S14 is juxtaposed to the thirteenth interconnect S13 along the second direction (the Y-axis direction) from the first interconnect S1 toward the second interconnect S2.

Herein, this includes the case where one or multiple interconnects are disposed between the ninth interconnect S9 and the tenth interconnect S10, the case where one or multiple interconnects are disposed between the eleventh interconnect S11 and the twelfth interconnect S12, and the case where one or multiple interconnects are disposed between the thirteenth interconnect S13 and the fourteenth interconnect 514.

In this embodiment, the ninth interconnect S9, the tenth interconnect S10, the thirteenth interconnect S13, and the fourteenth interconnect S14 are connected to ground supply lines 21. The third interconnect S3 and the fourth interconnect S4 are connected to the sense amplifiers 20.

The eleventh interconnect S11 is a third bit line electrically connected to the multiple first memory cell transistors of the first memory string; and the twelfth interconnect S12 is a fourth bit line electrically connected to multiple fourth memory cell transistors of a fourth memory string. Here, the first memory string and the third memory string may be physically juxtaposed; the first memory string may be referred to as the memory string of the odd side; and the third memory string may be referred to as the memory string of the even side. Similarly, the first memory string and the third memory string may be physically juxtaposed; the second memory string may be referred to as the memory string of the odd side; and the fourth memory string may be referred to as the memory string of the even side. The bit lines connected to the first interconnect S1 and the second interconnect S2 may be referred to as the odd-side bit lines; and the bit lines connected to the eleventh interconnect S11 and the twelfth interconnect S12 may be referred to as the even-side bit lines.

Here, to provide sameness with the layout of the first interconnect S1, the second interconnect S2, the eleventh interconnect S11, and the twelfth interconnect S12, it is favorable for the ninth interconnect S9, the tenth interconnect S10, the thirteenth interconnect S13, and the fourteenth interconnect S14 also to be drawn out in the first direction. It is also possible for the ninth interconnect S9, the tenth interconnect S10, the thirteenth interconnect S13, and the fourteenth interconnect S14 to be connected to, for example, lower layer interconnects or upper layer interconnects in the intermediate unit 230, to be drawn out in the second direction, and to be drawn out of the intermediate unit 230.

The intermediate unit 230 includes the first transistor TR1 and the second transistor TR2 described above.

The intermediate unit 230 further includes the third transistor TR3 and the fourth transistor TR4. The third transistor TR3 is provided in the major surface 205a on the side of the first one diffusion layer DA1 opposite to the first gate electrode G01 juxtaposed to the first transistor TR1 along the first direction (the X-axis direction). The fourth transistor TR4 is provided in the major surface 205a juxtaposed to the third transistor TR3 along the second direction (the Y-axis direction) and juxtaposed to the second transistor TR2 along the first direction.

The third transistor TR3 includes the third one diffusion layer DA3 and the third other diffusion layer DB3 provided in the major surface 205a and the third gate electrode G03 provided above the major surface 205a between the third one diffusion layer DA3 and the third other diffusion layer DB3 to extend in the second direction. In the first direction, the third one diffusion layer DA3 is disposed between the third gate electrode G03 and the first gate electrode G01.

The fourth transistor TR4 includes the fourth one diffusion layer DA4 and the fourth other diffusion layer DB4 provided in the major surface 205a and the fourth gate electrode G04 provided above the major surface 205a between the fourth one diffusion layer DA4 and the fourth other diffusion layer DB4 to extend in the second direction. The fourth gate electrode G04 is juxtaposed to the third gate electrode G03 along the second direction and is connected to the third gate electrode G03. In the first direction, the fourth one diffusion layer DA4 is disposed between the fourth gate electrode G04 and the second gate electrode G02.

The third one diffusion layer DA3 shares the first connection region CA1 with the first one diffusion layer DA1. The third one diffusion layer DA3 includes the third midpoint region EA3 provided on the third gate electrode G03 side of the first connection region CA1 and connected to the first connection region CA1. The width WEA3 of the third midpoint region EA3 along the second direction is narrower than the width WCA1 of the first connection region CA1 along the second direction.

The third other diffusion layer DB3 is electrically connected to the ninth interconnect S9. In this specific example, a ninth contact plug CP9 extending in the Z-axis direction is provided in the third other diffusion layer DB3; and the third other diffusion layer DB3 is electrically connected to the ninth interconnect S9 via the ninth contact plug CP9.

The width along the second direction of the boundary between the third gate electrode G03 and the third other diffusion layer DB3 is substantially equal to the width along the second direction of the boundary between the third gate electrode G03 and the third midpoint region EA3. For example, the former is not less than 80% and not more than 120% of the latter.

The fourth one diffusion layer DA4 shares the second connection region CA2 with the second one diffusion layer DA2. The fourth one diffusion layer DA4 includes the fourth midpoint region EA4 provided on the fourth gate electrode G04 side of the second connection region CA2 and connected to the second connection region CA2. The width WEA4 of the fourth midpoint region EA4 along the second direction is narrower than the width WCA2 of the second connection region CA2 along the second direction.

The fourth other diffusion layer DB4 is electrically connected to the tenth interconnect S10. In this specific example, a tenth contact plug CP10 extending in the Z-axis direction is provided in the fourth other diffusion layer DB4; and the fourth other diffusion layer DB4 is electrically connected to the tenth interconnect S10 via the tenth contact plug CP10.

The width along the second direction of the boundary between the fourth gate electrode G04 and the fourth other diffusion layer DB4 is substantially equal to the width along the second direction of the boundary between the fourth gate electrode G04 and the fourth midpoint region EA4. For example, the former is not less than 80% and not more than 120% of the latter. For example, the width along the second direction of the boundary between the fourth midpoint region EA4 and the fourth gate electrode G04 is greater than the width along the second direction of the fourth midpoint region EA4 at the central portion in the first direction. The width along the second direction of the boundary between the fourth other diffusion layer DB4 and the fourth gate electrode G04 is greater than the width along the second direction of the fourth midpoint region EA4 at the central portion in the first direction. As a result, the characteristic fluctuation of the fourth transistor TR4 can be suppressed. The width of the fourth other diffusion layer DB4 along the second direction is substantially equal to the width of the third other diffusion layer DB3 along the second direction. For example, the former is not less than 80% and not more than 120% of the latter.

The distance d3 along the first direction from the boundary B03 between the first connection region CA1 and the third midpoint region EA3 to the edge GE3 of the third gate electrode G03 on the first connection region CA1 side is shorter than the distance d4 along the first direction from the boundary B04 between the second connection region CA2 and the fourth midpoint region EA4 to the edge GE4 of the fourth gate electrode G04 on the second connection region CA2 side. Here, in the case where the distance from the edge GE1 to the edge GE3 is equal to the distance from the edge GE2 to the edge GE4, the lengths of the first midpoint region EA1 and the fourth midpoint region EA4 in the X-axis direction are equal to each other; and the lengths of the second midpoint region EA2 and the third midpoint region EA3 in the X-axis direction are equal to each other.

The width WEA1 of the first midpoint region EA1 along the second direction is narrower than the width WEA3 of the third midpoint region EA3 along the second direction. Similarly, the width WEA4 of the fourth midpoint region EA4 along the second direction is narrower than the width WEA2 of the second midpoint region EA2 along the second direction.

In the semiconductor device 202, the intermediate unit 230 further includes a fifth transistor TR5 and a sixth transistor TR6. The fifth transistor TR5 is provided in the major surface 205a on the side of the first other diffusion layer DB1 opposite to the first gate electrode G01 juxtaposed to the first transistor TR1 along the first direction (the X-axis direction). The sixth transistor TR6 is provided in the major surface 205a juxtaposed to the fifth transistor TR5 along the second direction (the Y-axis direction) and juxtaposed to the second transistor TR2 along the first direction.

The fifth transistor TR5 includes a fifth one diffusion layer DA5 provided in the major surface 205a. The fifth other diffusion layer DB5 of the fifth transistor TR5 shares the first other diffusion layer DB1 of the first transistor TR1. The fifth transistor TR5 includes a fifth gate electrode G05 provided above the major surface 205a between the fifth one diffusion layer DA5 and the first other diffusion layer DB1 to extend in the second direction.

The sixth transistor TR6 includes a sixth one diffusion layer DA6 provided in the major surface 205a. The sixth other diffusion layer DB6 of the sixth transistor TR6 shares the second other diffusion layer DB2 of the second transistor TR2. The sixth transistor TR6 includes a sixth gate electrode G06 provided above the major surface 205a between the sixth one diffusion layer DA6 and the second other diffusion layer DB2 to extend in the second direction. The sixth gate electrode G06 is juxtaposed to the fifth gate electrode G05 along the second direction and is connected to the fifth gate electrode G05.

The intermediate unit 230 further includes a seventh transistor TR7 and an eighth transistor TR8. The seventh transistor TR7 is provided in the major surface 205a on the side of the fifth one diffusion layer DA5 opposite to the fifth gate electrode G05 juxtaposed to the fifth transistor TR5 along the first direction (the X-axis direction). The eighth transistor TR8 is provided in the major surface 205a juxtaposed to the seventh transistor TR7 along the second direction (the Y-axis direction) and juxtaposed to the sixth transistor TR6 along the first direction.

A seventh one diffusion layer DA7 of the seventh transistor TR7 provided in the major surface 205a shares the fifth one diffusion layer DA5 of the fifth transistor TR5. The seventh transistor TR7 includes a seventh other diffusion layer DB7. The seventh transistor TR7 includes a seventh gate electrode G07 provided above the major surface 205a between the fifth one diffusion layer DA5 and the seventh other diffusion layer DB7 to extend in the second direction.

An eighth one diffusion layer DA8 of the eighth transistor TR8 provided in the major surface 205a shares the sixth one diffusion layer DA6 of the sixth transistor TR6. The eighth transistor TR8 includes an eighth other diffusion layer DB8. The eighth transistor TR8 includes an eighth gate electrode G08 provided above the major surface 205a between the sixth one diffusion layer DA6 and the eighth other diffusion layer DB8 to extend in the second direction. The eighth gate electrode G08 is juxtaposed to the seventh gate electrode G07 along the second direction and is connected to the seventh gate electrode G07.

The pattern of the fifth transistor TR5 to the eighth transistor TR8 is formed by disposing the first transistor TR1 to the fourth transistor TR4 repeatedly in the first direction.

In the semiconductor device 202 having such a configuration as well, the reduction of the width W1 can be relaxed when reducing the transistor disposition pitch TRp. Because the first connection region CA1, which is shared by the first transistor TR1 and the third transistor TR3, in a zigzag configuration with the second connection region CA2, which is shared by the second transistor TR2 and the fourth transistor TR4 are disposed. Here, focusing on the connection region of each (the first connection region CA1 to the fourth connection region CA4), it also can be said that the connection regions are disposed in a staggered configuration.

According to the semiconductor device 202, a semiconductor device can be provided in which high reliability is realized while the chip surface area is reduced.

Figure 13:
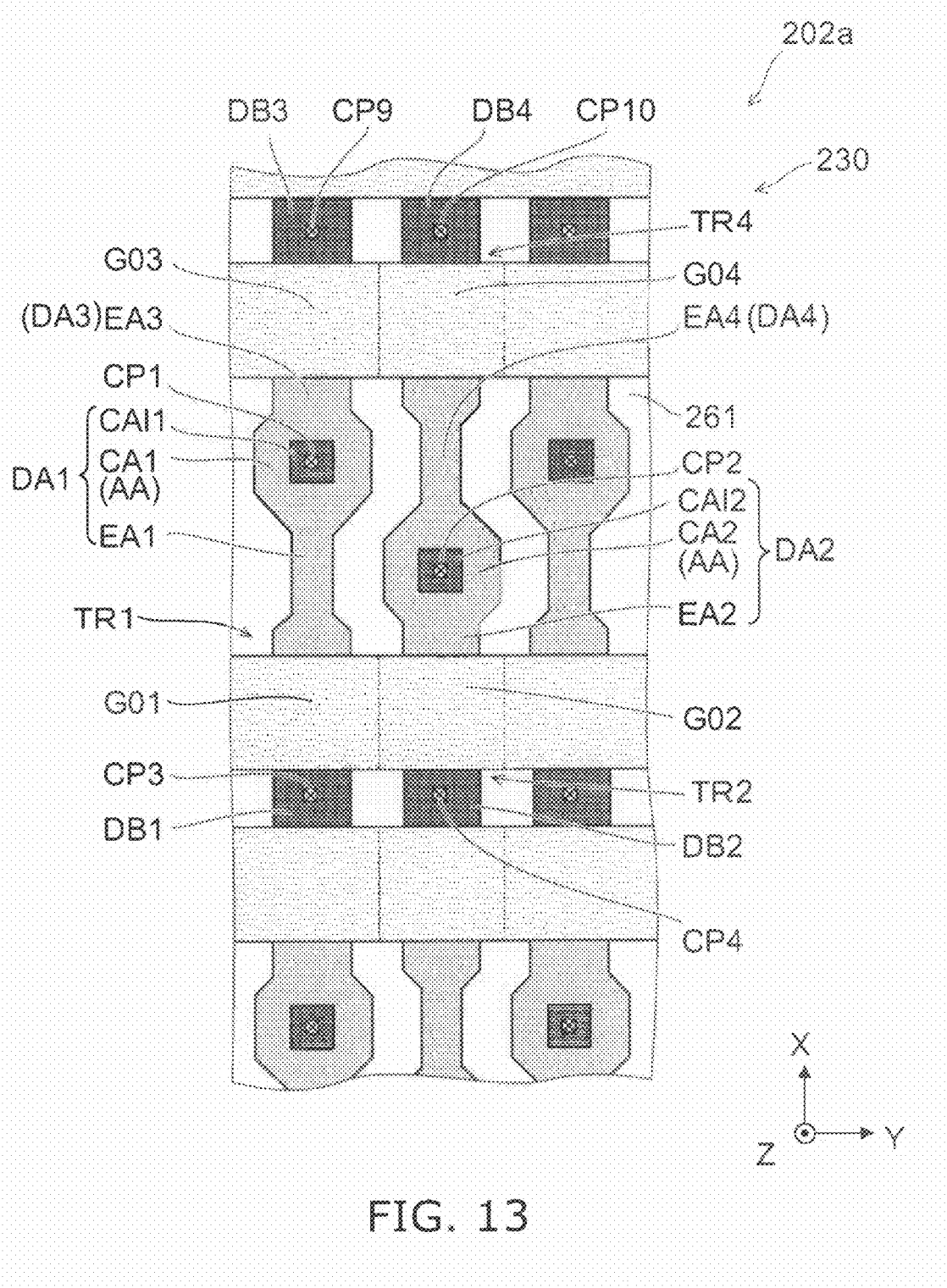
FIG. 13 is a schematic plan view illustrating the configuration of another semiconductor device according to the second embodiment.

FIG. 13 is a schematic plan view illustrating the configuration of another semiconductor device according to the second embodiment.

In the another semiconductor device 202a according to this embodiment as illustrated in FIG. 13, the mutually proximal corner portions of the first connection region CA1 and the second connection region CA2 oppose each other in a direction oblique with respect to the X-axis direction. In other words, the portion of the first connection region CA1 proximal to the second connection region CA2 along a direction oblique with respect to the X-axis direction is perpendicular to the direction from the first connection region CA1 (e.g., the center thereof) toward the second connection region CA2 (e.g., the center thereof). Similarly, the portion of the second connection region CA2 proximal to the first connection region CA1 along a direction oblique with respect to the X-axis direction is perpendicular to the direction from the first connection region CA1 (e.g., the center thereof) toward the second connection region CA2 (e.g., the center thereof).

Thus, the corner portions of the first connection region CA1 and the second connection region CA2, which are proximal to each other in a direction oblique with respect to the X-axis direction, are oblique to the X-axis direction. Then, the distance between the corner portions can be increased; and, for example, the distance between the first inner connection region CAI1 and the second inner connection region CAI2 can be reduced. As a result, in the semiconductor device 202a as well, the distance along the X-axis direction of the transistor formation region can be reduced. Further, the electric field concentration in the corner portions can be mitigated by the corner portions having configurations such as those recited above. As a result, it is possible to increase the junction breakdown voltage of the respective transistors.

Second Example

A nonvolatile semiconductor memory device 302 which is a semiconductor device of a second example according to the second embodiment will now be described. The nonvolatile semiconductor memory device 302 is a NAND flash memory. Hereinbelow, the portions of the nonvolatile semiconductor memory device 302 corresponding to the first circuit unit 210, the second circuit unit 220, and the intermediate unit 230 are described and the other portions are omitted from the description.

Figure 14:
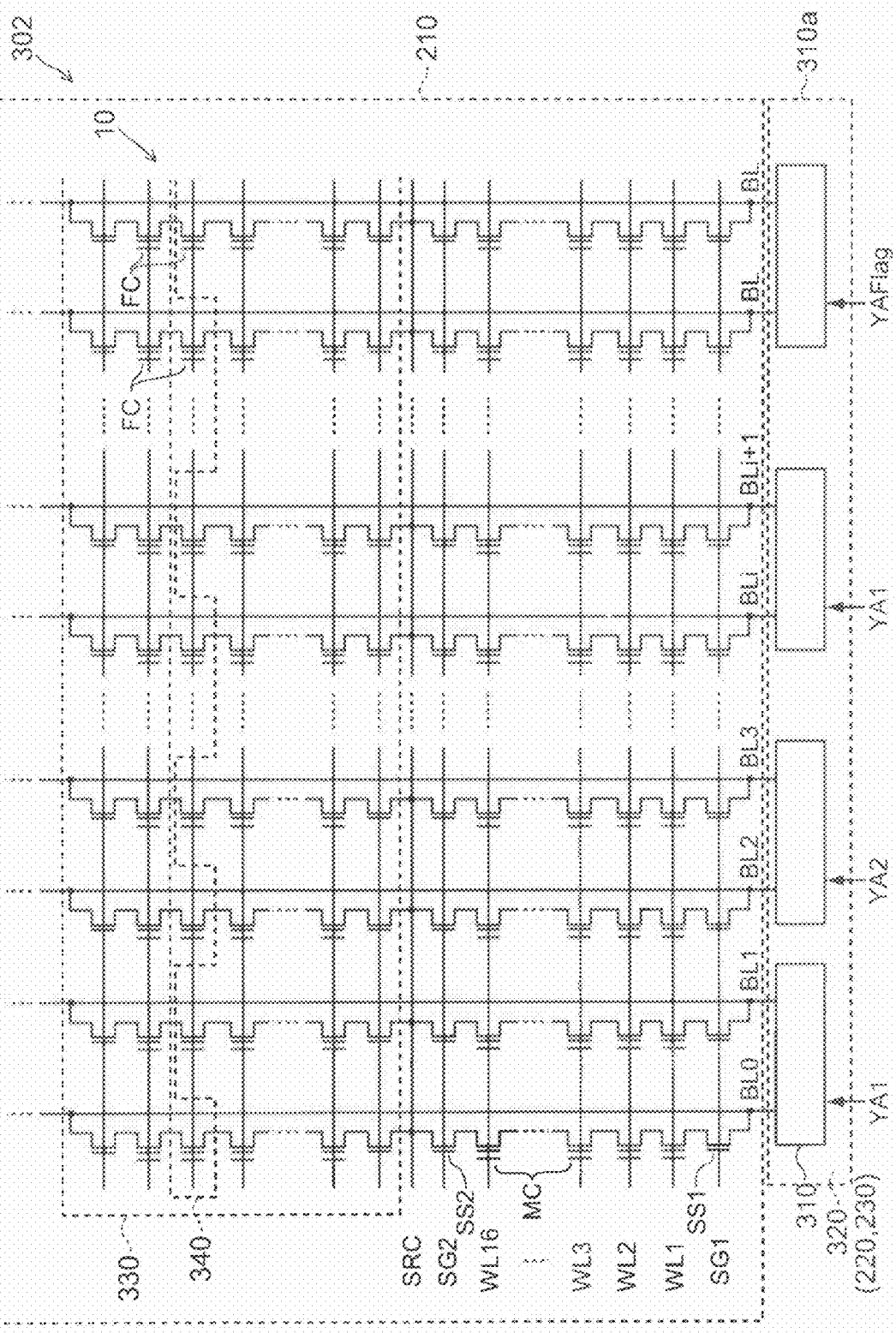
FIG. 14 is a schematic view illustrating the configuration of the semiconductor device according to the second example.

FIG. 14 is a schematic view illustrating the configuration of the semiconductor device according to the second example.

Figure 15:
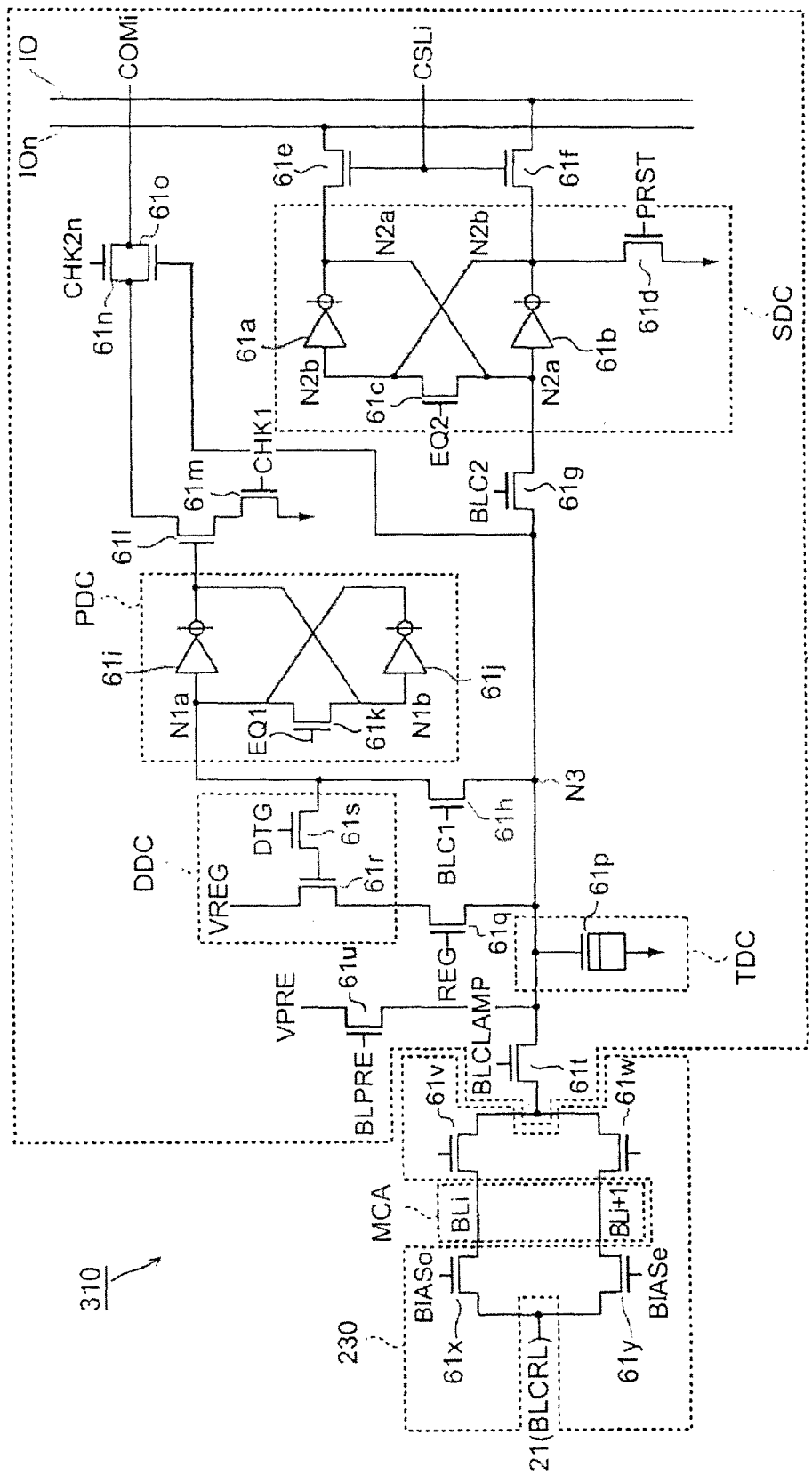
FIG. 15 is a circuit diagram illustrating the configuration of a portion of the semiconductor device according to the second example.

FIG. 15 is a circuit diagram illustrating the configuration of a portion of the semiconductor device according to the second example.

As illustrated in FIG. 14, the nonvolatile semiconductor memory device 302 includes the memory cell array 10 and data storage circuits 310. The memory cell array 10 corresponds to the first circuit unit 210. The second circuit unit 220 and the intermediate unit 230 are included in the data storage circuits 310.

The configuration of the memory cell array 10 of the nonvolatile semiconductor memory device 302 may be similar to that of the nonvolatile semiconductor memory device 301, and a description is therefore omitted.

The memory cell array 10 includes multiple blocks 330 as illustrated by the broken line. Each of the blocks 330 includes multiple NAND cells. The block 330 is the unit by which data is erased. In this specific example, the erasing operation is performed simultaneously for the two bit lines connected to the data storage circuit 310 and a flag data storage circuit 310a.

A bit line control circuit 320 includes the multiple data storage circuits 310 and flag data storage circuits 310a. Each of the data storage circuits 310 and flag data storage circuits 310a is connected to a pair of bit lines (BL0, BL1), (BL2, BL3), . . . , (BLi, BLi+1), (BL, BL). Each of the data storage circuits 310 has the function of retaining the data read from memory cells MC and the function of retaining the data to be programmed to the memory cells MC.

The multiple memory cells (the memory cells in the area enclosed with the broken line) disposed at every other bit line and connected to one word line form one sector 340. Data is programmed or read for each sector 340. Two pages of data, for example, are stored in one sector 340. A flag cell FC for storing the flag data FLAG is connected to each of the word lines.

During the read operation, the program verify operation, and the program operation, one of the two bit lines (BLi, BLi+1) connected to the data storage circuit 310 is selected according to an externally designated address signal (YA1, YA2, . . . , YAi, YAFlag). Further, according to the external address, one word line is selected and one sector 340 (i.e., two pages) is selected. The switching between the two pages is performed by the address.

An example of the configuration of the data storage circuit 310 will now be described. The configuration of the flag data storage circuit 310a is substantially similar to that of the data storage circuit 310, and a description is therefore omitted.

As illustrated in FIG. 15, the data storage circuit 310 includes a primary data cache (PDC), a secondary data cache (SDC), a dynamic data cache (DDC), and a temporary data cache (TDC).

The SDC, the PDC, and the DDC have the functions of retaining the input data during the programming, retaining the read-out data during the read out, retaining the data temporarily during the verify, and storing the data for the operations of the internal data when storing multi-bit data. The TDC amplifies and temporarily retains the data of the bit line during the data read out and is used in the operations of the internal data when storing multi-bit data.

The SDC includes transistors 61c and 61d and clocked inverter circuits 61a and 61b which form a latch circuit. The transistor 61c is connected between the input terminal of the clocked inverter circuit 61a and the input terminal of the clocked inverter circuit 61b. A signal EQ2 is supplied to the gate of the transistor 61c.

The transistor 61d is connected between the output terminal of the clocked inverter circuit 61b and the ground. A signal PRST is supplied to the gate of the transistor 61d.

A node N2a (the output terminal of the clocked inverter circuit 61a) of the SDC is connected to an input/output data line IOn via a column selection transistor 61e. A node N2b (the output terminal of the clocked inverter circuit 61b) is connected to the input/output data line IO via a column selection transistor 61f. A column selection signal CSLi is supplied to the gates of the column selection transistors 61e and 61f.

The PDC includes a transistor 61k and clocked inverter circuits 61i and 61j which form a latch circuit. The transistor 61k is connected between the input terminal of the clocked inverter circuit 61i and the input terminal of the clocked inverter circuit 61j. A signal EQ1 is supplied to the gate of the transistor 61k. A node N1a of the PDC and the node N2a of the SDC are connected by transistors 61g and 61h. A signal BLC2 is supplied to the gate of the transistor 61g; and a signal BLC1 is supplied to the gate of the transistor 61h.

A node N1b (the input terminal of the clocked inverter circuit 61j) of the PDC is connected to the gate of a transistor 61l. One terminal of the current path of the transistor 61l is grounded via a transistor 61m. A signal CHK1 is supplied to the gate of the transistor 61m. The other terminal of the current path of the transistor 61l is connected to one terminal of each of the current paths of transistors 61n and 61o used as transfer gates. A signal CHK2n is supplied to the gate of the transistor 61n. The gate of the transistor 61o is connected to the connection node between the transistor 61g and the transistor 61h.

A signal COMi is supplied to the other terminals of the current paths of the transistors 61n and 61o. The signal COMi is a signal common to all of the data storage circuits 310 and is a signal that indicates whether or not the verifies of all of the data storage circuits 310 are completed.

A MOS capacitor 61p, for example, is provided in the TDC. The MOS capacitor 61p is connected between the ground and a connection node N3 of the transistors 61g and 61h. The DDC also is connected to the connection node N3 via a transistor 61q. A signal REG is supplied to the gate of the transistor 61q.

Transistors 61r and 61s are provided in the DDC. A signal VREG is supplied to one terminal of the current path of the transistor 61r; and the other terminal is connected to the current path of the transistor 61q. The gate of the transistor 61r is connected to the node N1a of the PDC via the transistor 61s. A signal DTG is supplied to the gate of the transistor 61s.

One terminal of each of the current paths of transistors 61t and 61u is connected to the connection node N3. A signal VPRE is supplied to the other terminal of the current path of the transistor 61u; and a signal BLPRE is supplied to the gate of the transistor 61u.

The signal having a voltage BLCLAMP is supplied to the gate of the transistor 61t. The other terminal of the current path of the transistor 61t is connected to the bit line BLi of a memory cell array MCA via a transistor 61v or is connected to the bit line BLi+1 of the memory cell array MCA via a transistor 61w.

The other terminal of the bit line BLi is connected to one terminal of the current path of a transistor 61x. A signal BIASo is supplied to the gate of the transistor 61x. The other terminal of the bit line BLi+1 is connected to one terminal of the current path of a transistor 61y. A signal BIASe is supplied to the gate of the transistor 61y. A signal BLCRL is supplied to the other terminals of the current paths of the transistors 61x and 61y. The transistors 61x and 61y are switched ON complimentarily with the transistors 61v and 61w according to the signals BIASo and BIASe to supply the potential of the signal BLCRL to the unselected bit lines.

The transistors 61v, 61w, 61x, and 61y of the data storage circuit 310 having such a configuration are included in the intermediate unit 230. The SDC, the PDC, the DDC, and the various transistors, etc., are included in the second circuit unit 220 illustrated by the dotted line in FIG. 15.

For example, the bit line BLi corresponds to the first interconnect S1, the bit line BLi+1 corresponds to the eleventh interconnect S11, the transistor 61v corresponds to the first transistor TR1, the transistor 61w corresponds to the fifth transistor TR5, the transistor 61x corresponds to the third transistor TR3, and the transistor 61y corresponds to the seventh transistor TR7.

The intermediate unit 230 is the portion in which the first transistor TR1 to the eighth transistor TR8 are disposed repeatedly. The ground supply line 21 (BLCRL) is the point where the draw out is performed to the outside of the intermediate unit 230 region by the ninth interconnect S9, the tenth interconnect S10, the thirteenth interconnect S13, and the fourteenth interconnect S14 or by the lower layer interconnects or the upper layer interconnects connected to these interconnects. Although the ground supply line 21 is not included in the second circuit unit 220 in FIG. 15, in the case of being drawn out to the second circuit unit 220, the ground supply line 21 is included in the second circuit unit 220. In the case where the ninth interconnect S9, the tenth interconnect S10, the thirteenth interconnect S13, and the fourteenth interconnect S14 have a common connection by the upper layer interconnects or the lower layer interconnects in the intermediate unit 230, the common portion also is included in the intermediate unit 230.

In the nonvolatile semiconductor memory device 302 having such a configuration, the configurations according to the second embodiment may be applied to the memory cell array 10 which is the first circuit unit 210 and the data storage circuits 310 which are the second circuit unit 220 and the intermediate unit 230.

By employing the configuration according to this embodiment in the nonvolatile semiconductor memory device 302, a semiconductor device can be realized in which high reliability is realized while the occupied width of the intermediate unit 230 is reduced and the chip surface area is reduced.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor devices such as first circuit units, second circuit units, intermediate units, interconnects, transistors, diffusion layers, connection regions, midpoint regions, semiconductor substrates, contact plugs, and the like from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first circuit unit provided in a major surface of a semiconductor substrate;
   a second circuit unit provided in the major surface to oppose the first circuit unit along a first direction parallel to the major surface; and
   an intermediate unit provided between the first circuit unit and the second circuit unit,
   the first circuit unit including:
      a first interconnect provided above the major surface to extend in the first direction; and
      a second interconnect provided above the major surface to extend in the first direction, the second interconnect being juxtaposed to the first interconnect along a second direction parallel to the major surface and perpendicular to the first direction,
   the second circuit unit including:
      a third interconnect provided above the major surface to extend in the first direction; and
      a fourth interconnect provided above the major surface to extend in the first direction, the fourth interconnect being juxtaposed to the third interconnect along the second direction from the first interconnect toward the second interconnect, the intermediate unit including:
  a first transistor including a first one diffusion layer, a first other diffusion layer, and a first gate electrode, the first one diffusion layer and the first other diffusion layer being provided in the major surface, the first gate electrode being provided above the major surface between the first one diffusion layer and the first other diffusion layer to extend in the second direction; and
  a second transistor provided in the major surface juxtaposed to the first transistor along the second direction from the first interconnect toward the second interconnect, the second transistor including a second one diffusion layer, a second other diffusion layer, and a second gate electrode, the second one diffusion layer and the second other diffusion layer being provided in the major surface, the second gate electrode being provided above the major surface between the second one diffusion layer and the second other diffusion layer to extend in the second direction, the second gate electrode being juxtaposed to the first gate electrode along the second direction and connected to the first gate electrode, the first one diffusion layer including a first connection region, a first midpoint region provided on the first gate electrode side of the first connection region and connected to the first connection region, and a first inner connection region provided inside the first connection region and electrically connected to the first interconnect, a width of the first midpoint region along the second direction being narrower than a width of the first connection region along the second direction, the first other diffusion layer being electrically connected to the third interconnect, the second one diffusion layer including a second connection region, a second midpoint region provided on the second gate electrode side of the second connection region and connected to the second connection region, and a second inner connection region provided inside the second connection region and electrically connected to the second interconnect, a width of the second midpoint region along the second direction being narrower than a width of the second connection region along the second direction, the second other diffusion layer being electrically connected to the fourth interconnect, an impurity type of the first and second connection regions, the first and second midpoint regions, and the first and second inner connection regions being a first conductivity type, an impurity concentration of the first and second inner connection regions being higher than an impurity concentration of the first and second connection regions, a distance along the first direction from a boundary between the first connection region and the first midpoint region to an edge of the first gate electrode on the first connection region side being longer than a distance along the first direction from a boundary between the second connection region and the second midpoint region to an edge of the second gate electrode on the second connection region side.

2. The device according to claim 1, wherein:
the first circuit unit further includes
  a first memory string including a plurality of first memory cell transistors juxtaposed in the first direction, and
  a second memory string juxtaposed to the first memory string along the second direction, the second memory string including a plurality of second memory cell transistors juxtaposed along the first direction;
the first interconnect is a first bit line electrically connected to the plurality of first memory cell transistors of the first memory string;
the second interconnect is a second bit line electrically connected to the plurality of second memory cell transistors of the second memory string; and
the second circuit unit further includes
  a first sense amplifier electrically connected to the third interconnect to identify data stored in the plurality of first memory cell transistors of the first memory string, and
  a second sense amplifier electrically connected to the fourth interconnect to identify data stored in the plurality of second memory cell transistors of the second memory string.

3. The device according to claim 1, wherein a width of the first connection region along the second direction is greater than ½ of a distance along the second direction from a center of the first connection region along the second direction to a center of the second connection region along the second direction.

4. The device according to claim 1, wherein a width along the second direction of a boundary between the first midpoint region and the first gate electrode is greater than a width along the second direction of a central portion of the first midpoint region along the first direction.

5. The device according to claim 4, wherein a width along the second direction of a boundary between the first other diffusion layer and the first gate electrode is greater than the width along the second direction of the central portion of the first midpoint region along the first direction.

6. The device according to claim 1, wherein a width of the second other diffusion layer along the second direction is equal to a width of the first other diffusion layer along the second direction.

7. The device according to claim 1, wherein the first midpoint region opposes the second connection region along the second direction.

8. The device according to claim 1, wherein
a corner portion of the first connection region proximal to the second connection region has a side along a fourth direction tilted with respect to the first direction, and
a corner portion of the second connection region proximal to the first connection region has a side along the fourth direction.

9. The device according to claim 1, wherein:
the first circuit unit further includes
  a fifth interconnect provided above the major surface to extend in the first direction, and
  a sixth interconnect provided above the major surface to extend in the first direction, the sixth interconnect being juxtaposed to the fifth interconnect along the second direction from the first interconnect toward the second interconnect;
the second circuit unit further includes
  a seventh interconnect provided above the major surface to extend in the first direction, and
  an eighth interconnect provided above the major surface to extend in the first direction, the eighth interconnect being juxtaposed to the seventh interconnect along the second direction from the first interconnect toward the second interconnect;

the intermediate unit further includes
a third transistor provided in the major surface on a side of the first one diffusion layer opposite to the first gate electrode, the third transistor being juxtaposed to the first transistor along the first direction, and
a fourth transistor provided in the major surface juxtaposed to the third transistor along the second direction and juxtaposed to the second transistor along the first direction,
the third transistor including a third one diffusion layer, a third other diffusion layer, and a third gate electrode, the third one diffusion layer and the third other diffusion layer being provided in the major surface, the third gate electrode being provided above the major surface between the third one diffusion layer and the third other diffusion layer to extend in the second direction, the third one diffusion layer being disposed between the third gate electrode and the first gate electrode,
the fourth transistor including a fourth one diffusion layer, a fourth other diffusion layer, and a fourth gate electrode, the fourth one diffusion layer and the fourth other diffusion layer being provided in the major surface, the fourth gate electrode being provided above the major surface between the fourth one diffusion layer and the fourth other diffusion layer to extend in the second direction, the fourth gate electrode being juxtaposed to the third gate electrode along the second direction and connected to the third gate electrode, the fourth one diffusion layer being disposed between the fourth gate electrode and the second gate electrode,
the third one diffusion layer including a third connection region, a third midpoint region provided on the third gate electrode side of the third connection region and connected to the third connection region, and a third inner connection region provided inside the third connection region and electrically connected to the fifth interconnect, a width of the third midpoint region along the second direction being narrower than a width of the third connection region along the second direction,
the third other diffusion layer being electrically connected to the seventh interconnect,
the fourth one diffusion layer including a fourth connection region, a fourth midpoint region provided on the fourth gate electrode side of the fourth connection region and connected to the fourth connection region, and a fourth inner connection region provided inside the fourth connection region and electrically connected to the sixth interconnect, a width of the fourth midpoint region along the second direction being narrower than a width of the fourth connection region along the second direction,
the fourth other diffusion layer being electrically connected to the eighth interconnect;
an impurity type of the third and fourth connection regions, the third and fourth midpoint regions, and the third and fourth inner connection regions is the first conductivity type;
an impurity concentration of the third and fourth inner connection regions is higher than an impurity concentration of the third and fourth connection regions;
a distance along the first direction from a boundary between the third connection region and the third midpoint region to an edge of the third gate electrode on the third connection region side is shorter than a distance along the first direction from a boundary between the fourth connection region and the fourth midpoint region to an edge of the fourth gate electrode on the fourth connection region side; and
a distance from an edge of the first connection region on a side opposite to the first gate electrode to an edge of the first gate electrode on the first connection region side is longer than a distance from an edge of the third connection region on a side opposite to the third gate electrode to an edge of the third gate electrode on the third connection region side.

10. The device according to claim 9, wherein a width along the second direction of a boundary between the fourth midpoint region and the fourth gate electrode is greater than a width along the second direction of a central portion of the fourth midpoint region along the first direction.

11. The device according to claim 10, wherein a width along the second direction of a boundary between the fourth other diffusion layer and the fourth gate electrode is greater than the width along the second direction of the central portion of the fourth midpoint region along the first direction.

12. The device according to claim 9, wherein a distance from an edge of the first connection region on a side opposite to the first gate electrode to an edge of the first gate electrode on the first connection region side is longer than a distance from an edge of the fourth connection region on a side opposite to the fourth gate electrode to an edge of the second gate electrode on the fourth connection region side.

13. The device according to claim 9, wherein the first connection region and the fourth connection region have portions opposing each other along the second direction.

14. The device according to claim 9, wherein a distance from an edge of the second connection region on a side opposite to the second gate electrode to an edge of the second gate electrode on the second connection region side is shorter than a distance from an edge of the fourth connection region on a side opposite to the fourth gate electrode to an edge of the fourth gate electrode on the fourth connection region side.

15. The device according to claim 9, wherein
a corner portion of the first connection region proximal to the fourth connection region has a side along a fifth direction tilted with respect to the first direction, and
a corner portion of the fourth connection region proximal to the first connection region has a side along the fifth direction.

16. The device according to claim 9, wherein
a corner portion of the first connection region proximal to the second connection region has a curved configuration, and
a corner portion of the first connection region proximal to the fourth connection region has a curved configuration.

17. The device according to claim 1, wherein:
the second circuit unit further includes
a ninth interconnect provided above the major surface to extend in the first direction, and
a tenth interconnect provided above the major surface to extend in the first direction, the tenth interconnect being juxtaposed to the ninth interconnect along the second direction from the first interconnect toward the second interconnect;
the intermediate unit further includes
a third transistor provided in the major surface on a side of the first one diffusion layer opposite to the first gate electrode, the third transistor being juxtaposed to the first transistor along the first direction, and a fourth transistor provided in the major surface juxtaposed to the third transistor along the second direction and juxtaposed to the second transistor along the first direction, the third transistor including a third one diffusion layer, a third other diffusion layer, and a third gate electrode, the third one diffusion layer and the third other diffusion layer being provided in the major surface, the third gate electrode being provided above the major surface between the third one diffusion layer and the third other diffusion layer to extend in the second direction, the third one diffusion layer being disposed between the third gate electrode and the first gate electrode, the fourth transistor including a fourth one diffusion layer, a fourth other diffusion layer, and a fourth gate electrode, the fourth one diffusion layer and the fourth other diffusion layer being provided in the major surface, the fourth gate electrode being provided above the major surface between the fourth one diffusion layer and the fourth other diffusion layer to extend in the second direction, the fourth gate electrode being juxtaposed to the third gate electrode along the second direction and connected to the third gate electrode, the fourth one diffusion layer being disposed between the fourth gate electrode and the second gate electrode, the third one diffusion layer sharing the first connection region with the first one diffusion layer, the third one diffusion layer including a third midpoint region provided on the third gate electrode side of the first connection region and connected to the first connection region, a width of the third midpoint region along the second direction being narrower than a width of the first connection region along the second direction, the third other diffusion layer being electrically connected to the ninth interconnect, the fourth one diffusion layer sharing the second connection region with the second one diffusion layer, the fourth one diffusion layer including a fourth midpoint region provided on the fourth gate electrode side of the second connection region and connected to the second connection region, a width of the fourth midpoint region along the second direction being narrower than a width of the second connection region along the second direction, the fourth other diffusion layer being electrically connected to the tenth interconnect;

a distance along the first direction from a boundary between the first connection region and the third midpoint region to an edge of the third gate electrode on the first connection region side is shorter than a distance along the first direction from a boundary between the second connection region and the fourth midpoint region to an edge of the fourth gate electrode on the second connection region side; and a width of the first midpoint region along the second direction is narrower than a width of the third midpoint region along the second direction.

18. The device according to claim 17, wherein a width along the second direction of a boundary between the fourth midpoint region and the fourth gate electrode is greater than a width along the second direction of a central portion of the fourth midpoint region along the first direction.

19. The device according to claim 18, wherein a width along the second direction of a boundary between the fourth other diffusion layer and the fourth gate electrode is greater than the width along the second direction of the central portion of the fourth midpoint region along the first direction.

* * * * *